(12) United States Patent
Sim et al.

(10) Patent No.: US 9,570,660 B2
(45) Date of Patent: Feb. 14, 2017

(54) SEMICONDUCTOR LIGHT EMITTING DEVICE AND SEMICONDUCTOR LIGHT EMITTING APPARATUS HAVING THE SAME

(71) Applicant: SAMSUNG ELECTRONICS CO., LTD., Suwon-si (KR)

(72) Inventors: Jae In Sim, Yongin-si (KR); Sang Yeob Song, Suwon-si (KR); Jong Hoon Ha, Suwon-si (KR); Gi Bum Kim, Yongin-si (KR); Seung Woo Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/799,675

(22) Filed: Jul. 15, 2015

(65) Prior Publication Data
US 2016/0149086 A1 May 26, 2016

(30) Foreign Application Priority Data
Nov. 25, 2014 (KR) ........................ 10-2014-0165567

(51) Int. Cl.
*H01L 33/46* (2010.01)
*H01L 33/38* (2010.01)
*H01L 33/62* (2010.01)

(52) U.S. Cl.
CPC ............... *H01L 33/46* (2013.01); *H01L 33/38* (2013.01); *H01L 33/62* (2013.01)

(58) Field of Classification Search
CPC .......... H01L 33/38; H01L 33/44; H01L 33/46; H01L 33/507; H01L 33/52; H01L 33/62
See application file for complete search history.

(56) References Cited

U.S. PATENT DOCUMENTS

| | | | |
|---|---|---|---|
| 6,372,608 B1 | 4/2002 | Shimoda et al. | |
| 6,630,689 B2 * | 10/2003 | Bhat | H01L 33/20 257/79 |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |

(Continued)

*Primary Examiner* — Allan R Wilson
(74) *Attorney, Agent, or Firm* — Sughrue Mion, PLLC

(57) ABSTRACT

Provided is a semiconductor light emitting device. The semiconductor light emitting device may include: a light emitting structure comprising a first conductivity-type semiconductor layer having an upper surface divided into first and second regions, an active layer and a second conductivity-type semiconductor layer sequentially disposed on the second region of the first conductivity-type semiconductor layer; a first contact electrode disposed on the first region of the first conductivity-type semiconductor layer; a second contact electrode disposed on the second conductivity-type semiconductor layer; a first electrode pad electrically connected to the first contact electrode and having at least a portion disposed on the second contact electrode; a second electrode pad electrically connected to the second contact electrode; and a multilayer reflective structure interposed between the first electrode pad and the second contact electrode and comprising a plurality of dielectric layers which have different refractive indices and are alternately stacked.

12 Claims, 31 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,686,429 B2 | 4/2014 | Bergmann et al. |
| 8,735,931 B2 | 5/2014 | Han et al. |
| 8,766,295 B2 | 7/2014 | Kim et al. |
| 2003/0025212 A1* | 2/2003 | Bhat ............... H01L 33/20 257/780 |
| 2007/0273279 A1* | 11/2007 | Kobayashi ......... H01L 51/5265 313/507 |
| 2008/0185606 A1* | 8/2008 | Sano ............... H01L 33/42 257/98 |
| 2013/0015483 A1* | 1/2013 | Shimokawa ......... H01L 33/46 257/98 |
| 2013/0049053 A1* | 2/2013 | Kususe ............. H01L 33/405 257/98 |
| 2013/0292719 A1* | 11/2013 | Lee ............... H01L 33/08 257/93 |
| 2014/0166974 A1 | 6/2014 | Yoo et al. |
| 2014/0175465 A1 | 6/2014 | Lee et al. |
| 2014/0361330 A1* | 12/2014 | Hakuta ............. H01L 33/10 257/98 |
| 2015/0349207 A1* | 12/2015 | Sogo .............. H01L 33/0079 257/99 |
| 2016/0043290 A1* | 2/2016 | Sogo .............. H01L 33/486 257/98 |
| 2016/0064617 A1* | 3/2016 | Yang .............. H01L 33/46 257/98 |

* cited by examiner

A-A'

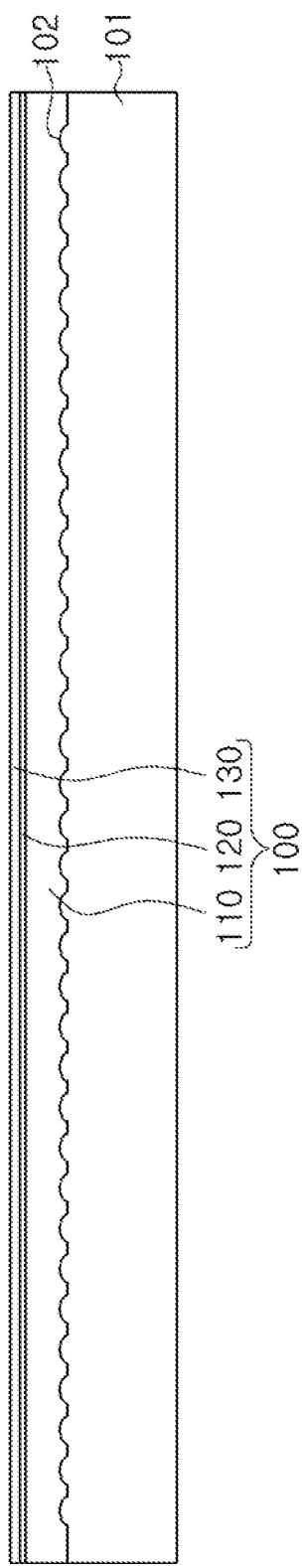

SEMICONDUCTOR LIGHT EMITTING DEVICE AND SEMICONDUCTOR LIGHT EMITTING APPARATUS HAVING THE SAME

CROSS-REFERENCE TO RELATED APPLICATION

This application claims the priority and benefit of Korean Patent Application No. 10-2014-0165567 filed on Nov. 25, 2014, in the Korean Intellectual Property Office, the disclosure of which is incorporated herein in its entirety by reference.

BACKGROUND

Apparatuses consistent with exemplary embodiments relate to a semiconductor light emitting device and a semiconductor light emitting apparatus including the same.

A light emitting diode (LED) is a device including a material emitting light when an electrical energy is applied thereto, in which energy generated through electron-hole recombination in semiconductor junction parts is converted into light to be emitted therefrom. LEDs are commonly employed as light sources in illumination devices, display devices, and the like, and thus, the development of LEDs has been accelerated.

As the development of gallium nitride (GaN)-based LEDs has recently increased, mobile keypads, turn signal lamps, camera flashes, and the like, using such gallium nitride-based LEDs, have been commercialized. Thus, development of general illumination devices using LEDs has been accelerated. Like the products to which they are applied, such as the backlight units of large TVs, the headlamps of vehicles, general illumination devices, and the like, the applications of light emitting devices are gradually moving toward large-sized products having high outputs and high degrees of efficiency.

In general, since flip-chip type LEDs have a limitation in that an electrode pad is widely disposed on a surface on which the LED is mounted, which absorbs light emitted from an active layer, external light extraction efficiency may decrease. Also, since the electrode pad is large, insulation with respect to a contact electrode having a different polarity disposed on a lower portion may not be secured.

SUMMARY

Exemplary embodiments of the inventive concept provide a scheme of reducing an amount of light absorbed by an electrode pad.

Exemplary embodiments of the inventive concept also provide a scheme of securing electrical insulation between a contact electrode and an electrode pad.

According to an aspect of an exemplary embodiment, there is provided a semiconductor light emitting device, the device may include: a light emitting structure comprising a first conductivity-type semiconductor layer having an upper surface divided into first and second regions, an active layer and a second conductivity-type semiconductor layer sequentially disposed in the second region of the first conductivity-type semiconductor layer, a first contact electrode disposed on the first region of the first conductivity-type semiconductor layer, a second contact electrode disposed on the second conductivity-type semiconductor layer, a first electrode pad electrically connected to the first contact electrode and having at least a portion disposed on the second contact electrode, a second electrode pad electrically connected to the second contact electrode, and a multilayer reflective structure interposed between the first electrode pad and the second contact electrode and comprising a plurality of dielectric layers which have different refractive indices and are alternately stacked.

The multilayer reflective structure may form a distributed Bragg reflector in which a first dielectric layer having a first refractive index and a second dielectric layer having a second refractive index are alternately stacked.

The first and second indices and thicknesses of the first and second dielectric layers of the multilayer reflective structure are adjusted to obtain a high degree of reflectivity with respect to a wavelength of light generated by the active layer.

The multilayer reflective structure is disposed on the light emitting structure to cover the light emitting structure overall and to redirect light traveling in an opposite direction of a substrate of the semiconductor light emitting device to a direction of the substrate.

The semiconductor light emitting device may further include an insulating layer disposed on the light emitting structure such that at least portions of the first and second contact electrodes are exposed.

The insulating layer may form a distributed Bragg reflector in which a plurality of dielectric layers having different refractive indices are alternately stacked.

The insulating layer may include the same material as that of the multilayer reflective structure.

The insulating layer has a substantially same thickness as a thickness of one dielectric layer of the multilayer reflective structure.

The first region may include a plurality of finger regions extending from one side of the light emitting structure to the other side thereof opposing the one side, and the first and second contact electrodes may include finger electrodes disposed in the plurality of finger regions.

The multilayer reflective structure may be disposed on the insulating layer and have a first opening exposing a region of the first contact electrode and a second opening exposing a region of the second contact electrode, and the first and second electrode pads may be connected to the first and second contact electrodes through the first and second openings, respectively.

A plurality of first and second openings may be provided, and the first and second electrode pads are connected to the first and second contact electrodes through the plurality of the first and second openings, respectively.

The first and second electrode pads may be disposed to traverse the plurality of finger regions.

The insulating layer is disposed on the multilayer reflective structure which comprises a plurality of openings disposed on the first and second contact electrodes, respectively.

The insulating layer comprises a plurality of openings disposed in positions corresponding to the first and second contact electrodes partially exposing the corresponding first and second contact electrodes.

At least a portion of the second electrode pad may be disposed on the first contact electrode, and at least a portion of the second electrode pad and the first contact electrode may be insulated by the multilayer reflective structure.

A portion of the multilayer reflective structure may be disposed to be in contact with a surface of the light emitting structure.

In the multilayer reflective structure, a plurality of dielectric layers having different refractive indices may be repeatedly stacked four to 20 times.

The plurality of dielectric layers of the multilayer reflective structure may be formed of a material selected from the group consisting of $SiO_x$, $SiN_x$, $Al_2O_3$, HfO, $TiO_2$, ZrO, and combinations thereof.

The semiconductor light emitting device may further include a passivation layer which is disposed on the electrode pads and comprises a plurality of bonding regions partially exposing the first and second electrode pads.

A portion of the plurality of bonding regions of the passivation layer are disposed to not overlap a portion of the plurality of openings of the multilayer reflective structure.

The passivation layer comprises the same material as a material of the multilayer reflective structure.

The passivation layer comprises open regions partially exposing the first and second electrode pads and connecting to a probe pin to determine whether the semiconductor light emitting device is operable before being mounted.

According to another aspect of an exemplary embodiment, there is provided a semiconductor light emitting device, the device may include: a light emitting structure including a first conductivity-type semiconductor layer, an active layer, and a second conductivity-type semiconductor layer sequentially stacked, and an etched region formed by removing portions of the second conductivity-type semiconductor layer and the active layer to expose a portion of the first conductivity-type semiconductor layer, a multilayer reflective structure disposed on the light emitting structure and having a plurality of openings, first and second contact electrodes electrically connected to the first and second conductivity-type semiconductor layers and disposed in the plurality of openings, an insulating layer covering the multilayer reflective structure and the first and second contact electrodes, a first electrode pad disposed in a region of the multilayer reflective structure including a region corresponding to an upper portion of the second contact electrode, and a second electrode pad electrically connected to the second contact electrode.

Under bump metallurgy layers may be further disposed on the first and second electrode pads.

The first and second electrode pads may have regions having substantially the same level.

According to another aspect of an exemplary embodiment, there is provided a semiconductor light emitting apparatus, the apparatus may include: a package body having a lead frame, and a semiconductor light emitting device disposed on the package body and connected to the lead frame, wherein the semiconductor light emitting device includes: a light emitting structure including a first conductivity-type semiconductor layer having an upper surface divided into first and second regions, an active layer and a second conductivity-type semiconductor layer sequentially disposed on the second region of the first conductivity-type semiconductor layer, a first contact electrode disposed in the first region of the first conductivity-type semiconductor layer, a second contact electrode disposed on the second conductivity-type semiconductor layer, a first electrode pad electrically connected to the first contact electrode and having at least a portion thereof disposed on the second contact electrode, a second electrode pad electrically connected to the second contact electrode, and a multilayer reflective structure interposed between the first electrode pad and the second contact electrode and including a plurality of dielectric layers having different refractive indices and alternately stacked.

The lead frame may include first and second lead frames, and the first and second electrode pads of the semiconductor light emitting devices and the first and second lead frames may be connected via solders.

The solder may include first and second solders respectively disposed on the first and second electrode pads, and the first and second solders may have the same thickness.

The semiconductor light emitting apparatus may further include: an encapsulant covering the semiconductor light emitting device, wherein the encapsulant may contain a wavelength conversion material converting a wavelength of light generated by the semiconductor light emitting device.

The multilayer reflective structure may form a distributed Bragg reflector.

According to another aspect of an exemplary embodiment, there is provided a semiconductor light emitting device, the device may include: a light emitting structure comprising a first conductivity-type semiconductor layer, an active layer, and a second conductivity-type semiconductor layer sequentially disposed on a substrate, wherein etched regions are formed by removing portions of the second conductivity-type semiconductor layer, the active layer, and the first conductivity-type semiconductor layer to expose at least a portion of the first conductivity-type semiconductor layer; a first contact electrode which is connected to the first conductivity-type semiconductor layer through a bottom surface of the etched region and comprises a plurality of electrode pad portions and a plurality of finger portions; a second contact electrode which is connected to the second conductivity-type semiconductor layer and comprises a reflective metal layer; a multilayer reflective structure which covers the light emitting structure and comprises a structure in which a plurality of dielectric layers having different refractive indices are alternately stacked; an electrode pad disposed on the multilayer reflective structure and electrically connected to the first conductivity-type semiconductor layer and the second conductivity-type semiconductor layer through the first and second contact electrodes, respectively; and a passivation layer which is disposed on the electrode pad and comprises a plurality of bonding regions partially exposing the electrode pad.

The semiconductor light emitting device may further include an insulating layer covering the multilayer reflective structure and the first and second contact electrodes.

The semiconductor light emitting device may further include a solder pad comprising a first solder pad and a second solder pad and disposed on the first and second electrode pads which are partially exposed through the bonding regions.

The electrode pad may include at least a pair of pads to electrically insulate the first conductivity-type semiconductor layer and the second conductivity-type semiconductor layer, wherein a first electrode pad is electrically connected to the first conductivity-type semiconductor layer through the first contact electrode, a second electrode pad is electrically connected to the second conductivity-type semiconductor layer through the second contact electrode, and the first and second electrode pads are separated to be electrically insulated.

The multilayer reflective structure may form a distributed Bragg reflector by adjusting the refractive indices and thicknesses of the alternately stacked layers.

The multilayer reflective structure may include a plurality of openings, and the first and second contact electrodes are partially exposed on the first and second conductivity-type semiconductor layers through the plurality of openings.

A portion of the plurality of bonding regions of the passivation layer are disposed not to overlap the plurality of openings of the multilayer reflective structure.

BRIEF DESCRIPTION OF DRAWINGS

The above and other aspects, features and advantages of the exemplary embodiments will be more clearly understood from the following detailed description taken in conjunction with the accompanying drawings, in which:

FIGS. 7A through 12B are views illustrating processes of manufacturing a semiconductor light emitting device, according to an exemplary embodiment;

DETAILED DESCRIPTION OF THE EXEMPLARY EMBODIMENTS

Figure 1:
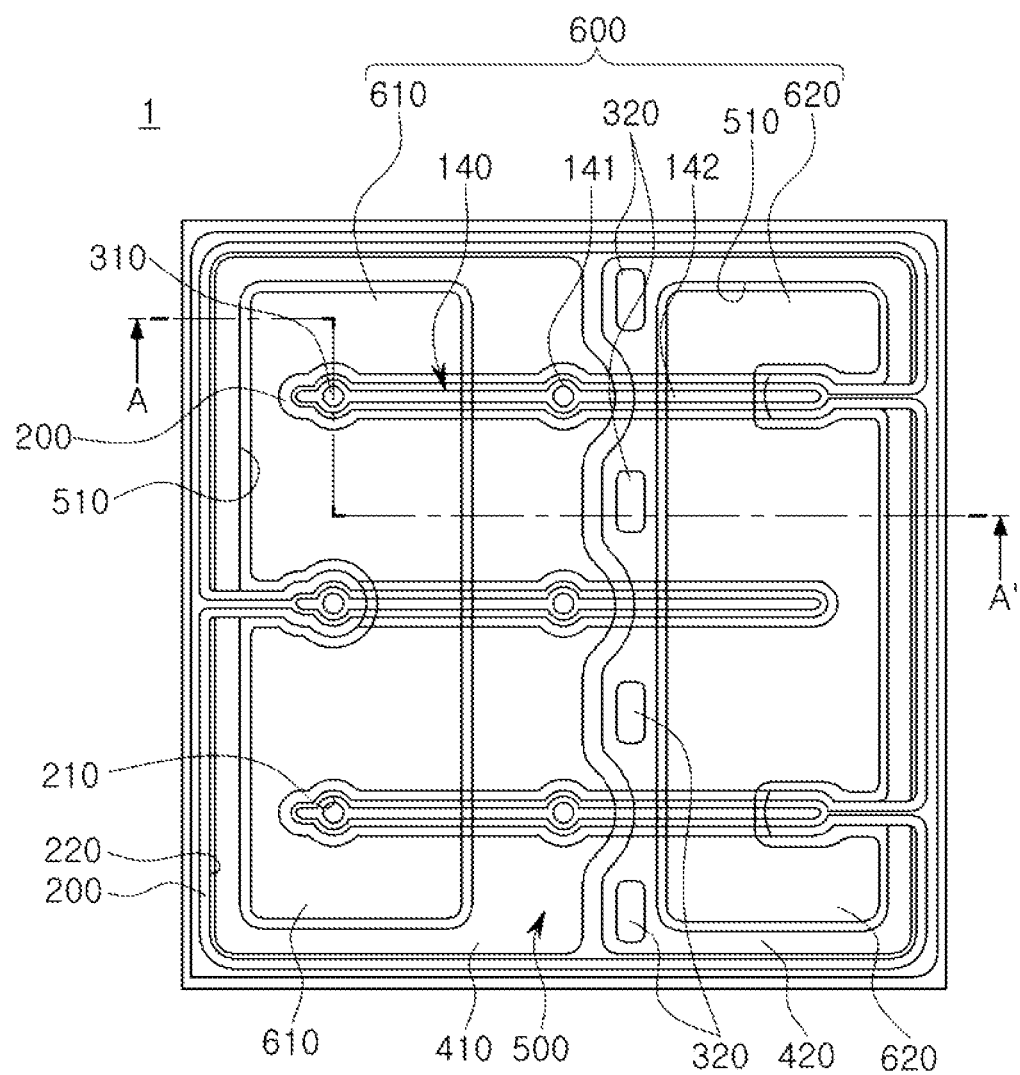
FIG. 1 is a plan view schematically illustrating a semiconductor light emitting device, according to an exemplary embodiment.

Various exemplary embodiments of the inventive concept will now be described more fully with reference to the accompanying drawings in which some embodiments are shown. The inventive concept may, however, be embodied in different forms and should not be construed as limited to the exemplary embodiments set forth herein. Rather, these exemplary embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an embodiment can be implemented differently, functions or operations described in a particular block may occur in a different way from a flow described in the flowchart. For example, two consecutive blocks may be performed simultaneously, or the blocks may be performed in reverse according to related functions or operations.

A semiconductor light emitting device package according to an exemplary embodiment will be described with reference to FIGS. 1 through 2B.

Figure 2A:
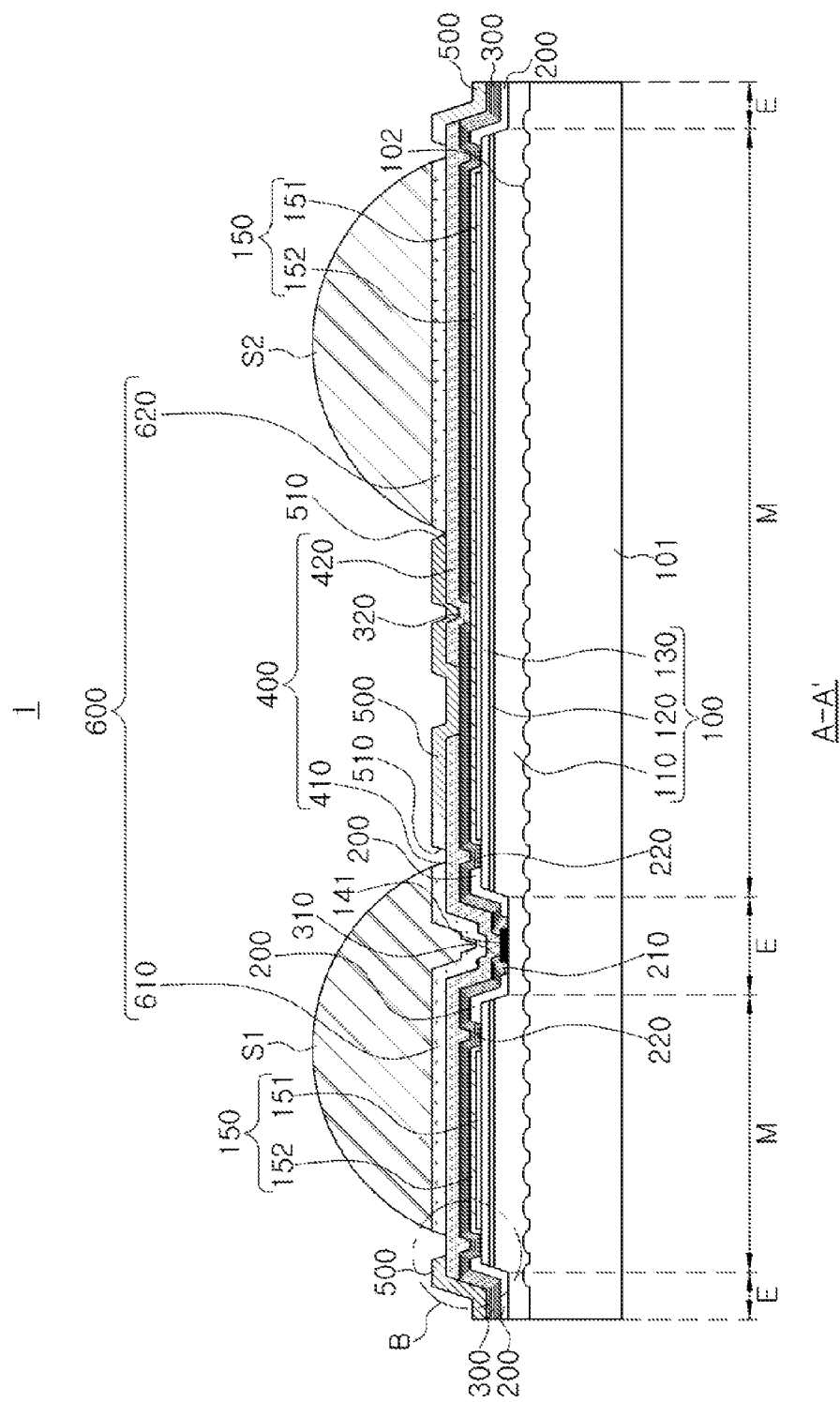
FIG. 2A is a cross-sectional view taken along line A-A' of the semiconductor light emitting device of FIG. 1.
Figure 2B:
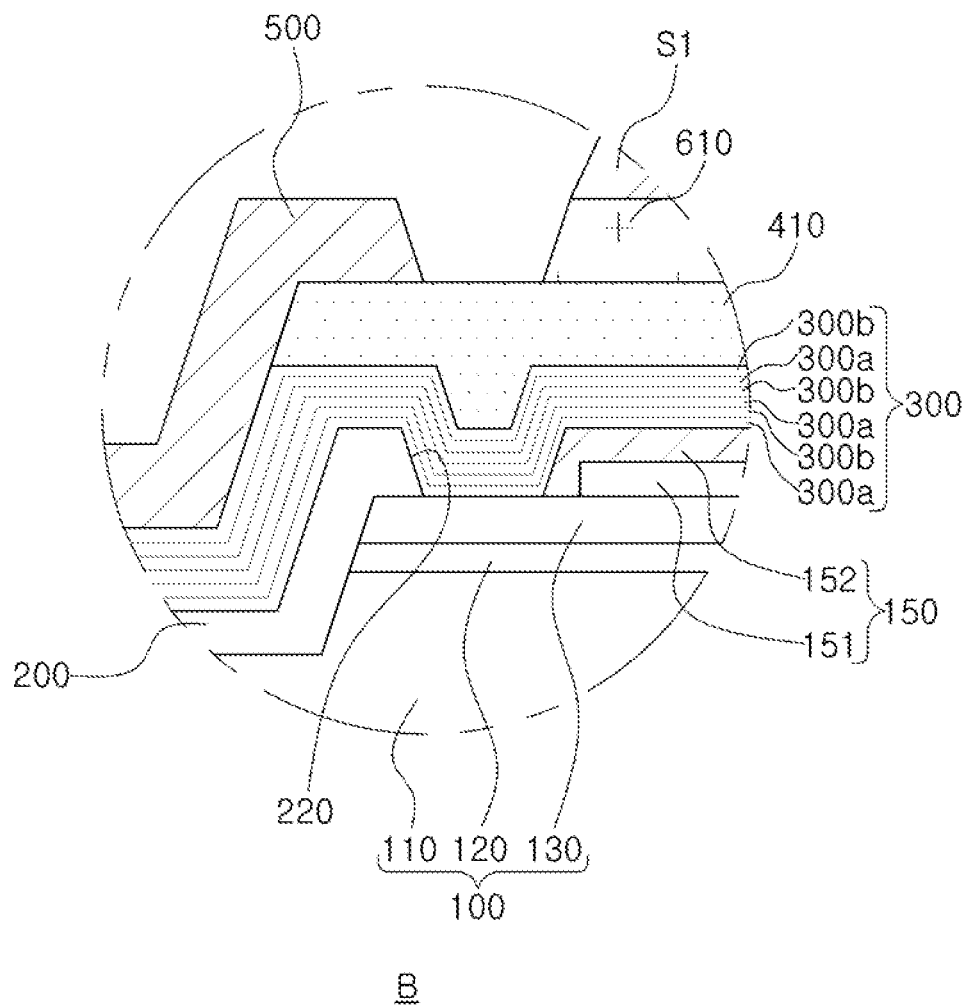
FIG. 2B is an enlarged view of a portion "B" of FIG. 2A.

FIG. 1 is a plan view schematically illustrating a semiconductor light emitting device according to an exemplary embodiment, FIG. 2A is a cross-sectional view taken along line A-A' of the semiconductor light emitting device of FIG. 1, and FIG. 2B is an enlarged view of a portion "B" of FIG. 2A.

Referring to FIGS. 1 and 2A, a semiconductor light emitting device 1 according to an exemplary embodiment may include a light emitting structure 100, first and second contact electrodes 140 and 150, first and second electrode pads 610 and 620, and multilayer reflective structures 300.

The light emitting structure 100 may have a structure in which a plurality of semiconductor layers are stacked, and may include a first conductivity-type semiconductor layer 110, an active layer 120, and a second conductivity-type semiconductor layer 130 sequentially stacked on a substrate 101.

The substrate 101 may have an upper surface extending in x and y directions. The substrate 101 may be provided as a semiconductor growth substrate and may be formed of an insulating, a conductive, or a semi-conductive material, such as sapphire, silicon (Si), SiC, $MgAl_2O_4$, MgO, $LiAlO_2$, $LiGaO_2$, or GaN. Sapphire, commonly used as a material of a nitride semiconductor growth substrate, is a crystal having electrical insulating properties, having Hexa-Rhombo R3c symmetry, and having a lattice constant of 13,001 Å on a c-axis and 4,757 Å on an a-axis. Sapphire has a C-plane (0001), an A-plane (11-20), and an R-plane (1-102). In this case, the C-plane is mainly used as a nitride growth substrate because it facilitates the growth of a nitride thin film and is stable at high temperatures.

As illustrated in the drawings, an irregular pattern 102 may be formed on an upper surface of the substrate 101, namely, on a growth surface of the semiconductor layers, and crystallinity, light emitting efficiency, and the like, of the semiconductor layers may be enhanced by the irregular pattern 102. In the exemplary embodiment, the irregular pattern 102 may have a dome-like convex shape, but is not limited thereto. For example, the irregular pattern 102 may have various shapes, such as a quadrangular shape, a triangular shape, and the like. In addition, the irregular pattern 102 may be selectively formed and omitted, according to exemplary embodiments.

The substrate 101 may be removed later in some exemplary embodiments. That is, after the substrate 101 is provided as a growth substrate for growing the first conductivity-type semiconductor layer 110, the active layer 120, and the second conductivity-type semiconductor layer 130, the substrate 101 may be removed through a separation process. The substrate 101 may be separated from the semiconductor layers through a laser lift-off (LLO) process, a chemical lift-off (CLO) process, and the like.

Although not illustrated in the drawings, a buffer layer may further be formed on an upper surface of the substrate 101. The buffer layer, serving to alleviate lattice defects in the semiconductor layers grown on the substrate 101, may be formed of an undoped semiconductor layer, such as a nitride. For example, the buffer layer may alleviate a difference in lattice constants between the sapphire substrate 101 and the first conductivity-type semiconductor layer 110 formed of GaN and stacked thereon to increase crystallinity of the GaN layer. The buffer layer may be undoped GaN, AlN, InGaN, and the like, and may be grown to have a thickness of tens to hundreds of angstroms at a low temperature of 500° C. to 600° C. Here, undoped refers to a semiconductor layer on which an impurity doping process has not been performed. The semiconductor layer may have an inherent level of impurity concentration. For example, when a gallium nitride semiconductor is grown by using a metal organic chemical vapor deposition (MOCVD) process, silicon (Si), or the like, used as a dopant, may be included in an amount approximately $10^{14}$ to $10^{18}/cm^3$ therein, although not intended. However, the buffer layer is not essential and may be omitted according to exemplary embodiments.

The first conductivity-type semiconductor layer 110 stacked on the substrate 101 may be formed of a semiconductor doped with an n-type impurity, such as an n-type nitride semiconductor layer. In addition, the second conductivity-type semiconductor layer 130 may be formed of a semiconductor doped with a p-type impurity, such as a p-type nitride semiconductor layer. Alternatively, according to an exemplary embodiment, the positions of the first and second conductivity-type semiconductor layers 110 and 130 may be interchanged. The first and second conductivity-type semiconductor layers 110 and 130 may have an empirical formula of $Al_xIn_yGa_{(1-x-y)}N$, where $0 \le x < 1$, $0 \le y < 1$, and $0 \le x+y < 1$, and may be, for example, GaN, AlGaN, InGaN, or AlInGaN.

The active layer 120 disposed between the first and second conductivity-type semiconductor layers 110 and 130 may emit light having a predetermined level of energy generated by electron-hole recombination. The active layer 120 may include a material having a smaller energy band gap than the first and second conductivity-type semiconductor layers 110 and 130. For example, when the first and second conductivity-type semiconductor layers 110 and 130 are formed of a GaN-based compound semiconductor, the active layer 120 may include an InGaN-based compound semiconductor having a smaller energy band gap than GaN. In addition, the active layer 120 may have a multi-quantum well (MQW) structure, for example, an InGaN/GaN structure, in which quantum well layers and quantum barrier layers are alternately stacked. However, the active layer 120 may not be limited thereto, and may have a single quantum well (SQW) structure.

As illustrated in FIG. 2A, the light emitting structure 100 may include an etched region E, in which portions of the second conductivity-type semiconductor layer 130, the active layer 120, and the first conductivity-type semiconductor layer 110 are etched, and a plurality of mesa regions M partially demarcated by the etched region E.

The etched region E may have a gap structure removed from one side of the light emitting structure 100 having a quadrangular shape to the other side of the light emitting structure 100 opposed thereto to have a predetermined thickness and length, and a plurality of etched regions E may be arranged in parallel with each other on an inner side of the quadrangular region of the light emitting structure 100. Thus, the plurality of etched regions E may be surrounded by the mesa regions M.

A first contact electrode 140 may be disposed on an upper surface of the first conductivity-type semiconductor layer 110 exposed to the etched region E and connected to the first conductivity-type semiconductor layer 110, and a second electrode 150 may be disposed on an upper surface of the plurality of mesa regions M and connected to the second conductivity-type semiconductor layer 130. The first and second contact electrodes 140 and 150 may be disposed on the first surface of the semiconductor light emitting device 1 on which the light emitting structure 100 is disposed. Thus, the first and second contact electrodes 140 and 150 may be disposed to be coplanar in the LED chip 10 and mounted on a package body 1002 (to be described later) in a flip-chip manner.

As illustrated in FIG. 1, the first contact electrode 140 may include a plurality of pad portions 141 and a plurality of finger portions 142 having a width smaller than that of the pad portions 141 and extending from the plurality of pad portions 141, respectively, along the etched regions E. A plurality of first contact electrodes 140 may be arranged to be spaced apart from one another so as to be evenly distributed on the overall first conductivity-type semiconductor layer 110. Thus, a current injected to the first conductivity-type semiconductor layer 110 may be evenly injected across the first conductivity-type semiconductor layer 110 through the plurality of first contact electrodes 140.

The plurality of pad portions 141 may be disposed to be spaced apart from one another, and the plurality of finger portions 142 may connect the plurality of pad portions 141. The plurality of finger portions 142 may have different widths from one another. For example, when the first contact electrode 140 has two finger portions 142 as illustrated in the exemplary embodiment, a width of any one finger portion 142 may be greater than that of the other finger portion 142. The width of the any one finger portion 142 may be adjusted in consideration of resistance of a current injected through the first contact electrode 140.

The second contact electrode 150 may include a reflective metal layer 151. In addition, the second contact electrode 150 may further include a coating metal layer 152 covering the reflective metal layer 151. However, the coating metal layer 152 may be selectively provided, and may be omitted according to exemplary embodiments. The second contact electrode 150 may cover an upper surface of the second conductivity-type semiconductor layer 130 defining an upper surface of the mesa region M.

In order to cover the active layer 120 exposed to the etched region E, an insulating layer 200 formed of an insulating material may be provided on the light emitting structure 100 including a lateral surface of the mesa region M. For example, the insulating layer 200 may be formed of an insulating material, such as $SiO_2$, SiN, $SiO_xN_y$, $TiO_2$, $Si_3N_4$, $Al_2O_3$, TiN, AlN, $ZrO_2$, TiAlN, or TiSiN. In addition, the insulating layer 200 may include first and second openings 210 and 220, exposing portions of the first and second conductivity-type semiconductor layers 110 and 130. The first and second contact electrodes 140 and 150 may be disposed within the first and second openings 210 and 220. The insulating layer 200 may prevent the first and second contact electrodes 140 and 150 and the active layer 120 from being electrically short-circuited, and prevent the first and second conductivity-type semiconductor layers 110 and 130 from being directly connected to the first and second conductivity-type semiconductor layers 110 and 130 electrically. In addition, by disposing the insulating layer 200, when a multilayer reflective structure 300 is deposited in a follow-up process, the multilayer reflective structure 300 may be easily attached. However, the insulating layer 200 may be selectively provided, and may be omitted according to exemplary embodiments. In addition, after the insulating layer 200 is deposited on the light emitting structure 100, when the surface of the insulating layer 200 is etched using plasma, a region of the insulating layer 200 protruding in a direction in which plasma is irradiated is etched to a greater degree and a recessed region thereof may be etched to a lesser degree. Thus, the surface of the insulating layer 200 may become smoother. If the insulating layer 200 is smooth, when the multilayer reflective structure 300 is deposited on the insulating layer 200, formation of a void within the multilayer reflective structure 300 is prevented, and quality of the multilayer reflective structure 300 is enhanced.

The multilayer reflective structure 300 may be provided on the light emitting structure 100 such that it covers the light emitting structure overall. The multilayer reflective structure 300 reflects light, among light emitted from the active layer 120, traveling in the opposite direction of the substrate 101, to redirect the light in a direction of the substrate 101.

In general, the flip-chiptype semiconductor light emitting device emits light generated by the active layer 120 in a direction toward the substrate 101. Thus, a large amount of light emitted in a direction toward the electrode pad 400, opposite to the direction of the substrate 101, may be absorbed by the semiconductor layer or the metal layer disposed above the active layer 120 and lost. In order to resolve the degradation of luminance caused as light is absorbed by the semiconductor layer or the metal layer, the multilayer reflective structure 300 is employed in the exemplary embodiment.

The multilayer reflective structure 300 may have a multilayer structure in which layers having different refractive indices are alternately stacked. This will be described in detail hereinafter. As illustrated in FIG. 2B, the multilayer reflective structure 300 may have a structure in which first dielectric layers 300a and second dielectric layers 300b having different refractive indices are alternately stacked.

By appropriately adjusting refractive indices and thicknesses of the first dielectric layers 300a and second dielectric layers 300b, the multilayer reflective structure 300 may be provided as a distributed Bragg reflector (DBR).

For example, when a wavelength of light generated by the active layer 120 is $\lambda$ and a refractive index of a corresponding layer is n, the first dielectric layer 300a and the second dielectric layer 300b of the multilayer reflective structure 300 may have a thickness equal to $\lambda/4n$, substantially having a thickness approximately 300 Å to 900 Å. Here, in the multilayer reflective structure 300, reflective indices and thicknesses of the first dielectric layer 300a and the second dielectric layer 300b may be selectively designed to obtain a high degree of reflectivity (95% or greater) with respect to a wavelength of light generated by the active layer 120.

Refractive indices of the first dielectric layer 300a and the second dielectric layer 300b may be determined within a range from about 1.4 to 2.5. The refractive indices of the first dielectric layer 300a and the second dielectric layer 300b may be smaller than that of the first conductivity-type semiconductor layer 110 and that of the substrate 101, or may be smaller than that of the first conductivity-type semiconductor layer 110 or greater than that of the substrate 101.

In addition, the multilayer reflective structure 300 may further include third to nth layers (n is a natural number equal to or greater than 4) having refractive indices different from those of the first dielectric layer 300a and the second dielectric layer 300b. The layers constituting the multilayer reflective structure 300 may have the same thickness or different thicknesses. In addition, the multilayer reflective structure 300 may be a structure in which the first dielectric layer 300a and the second dielectric layer 300b are repeatedly stacked four times to 20 times.

The multilayer reflective structure 300 may be formed of a material having insulating properties and light transmission characteristics, and may be formed of an inorganic material or an organic material. For example, the multilayer reflective structure 300 may include a silicon oxide or a silicon nitride having insulating properties and light transmission characteristics, and may be formed of $SiO_2$, SiN, $SiO_xN_y$, $TiO_2$, $Si_3N_4$, $Al_2O_3$, TiN, AlN, $ZrO_2$, TiAlN, or TiSiN. The multilayer reflective structure 300 may include a plurality of openings 310 and 320 disposed on each of the first contact electrode 140 and the second contact electrode 150. The plurality of openings 310 and 320 may be provided in positions corresponding to each of the first contact electrode 140 and the second contact electrode 150 to partially expose the first contact electrode 140 and the second contact electrode 150.

Figure 3A:
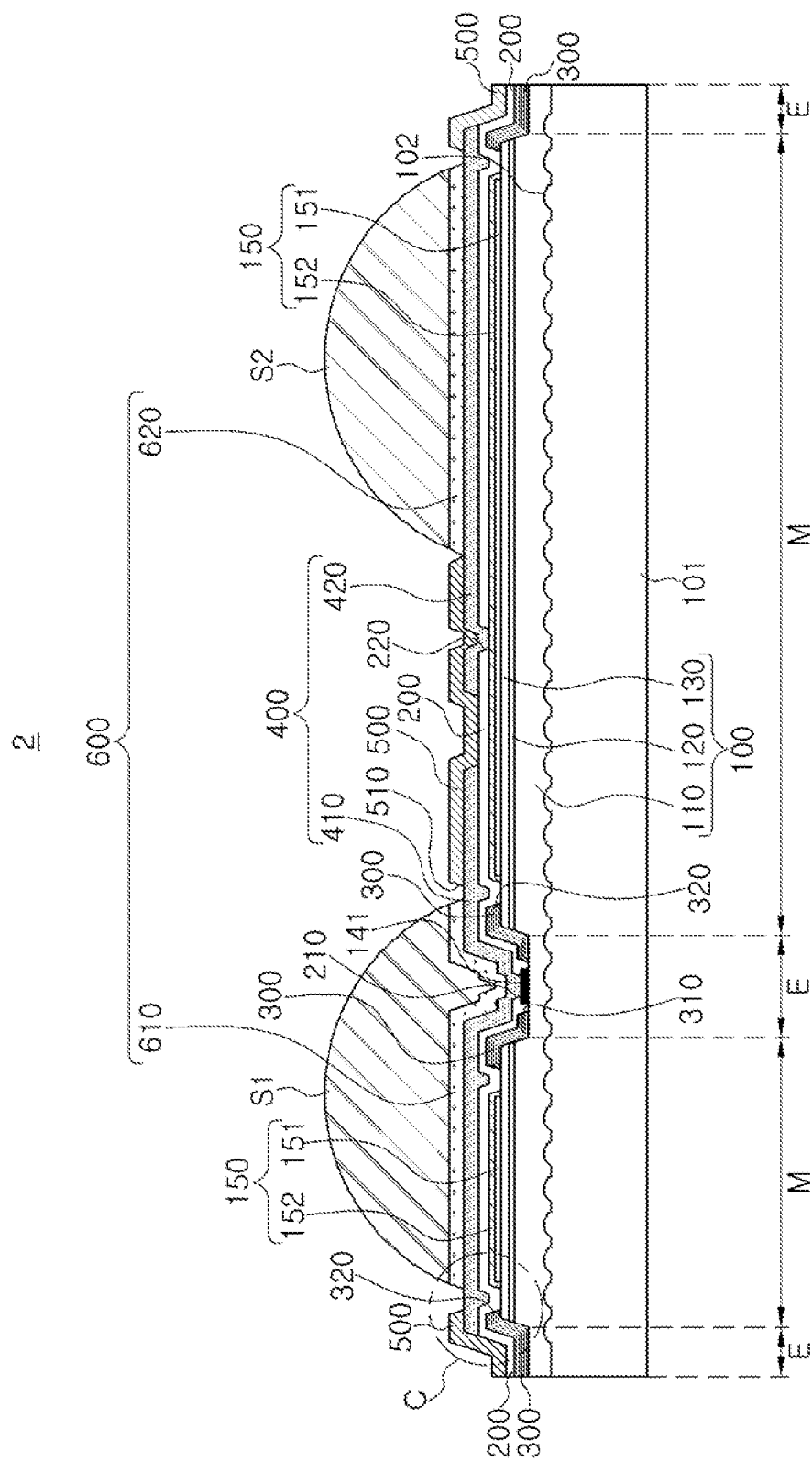
FIG. 3A is a modified example of the semiconductor light emitting device of FIG. 2A, according to an exemplary embodiment.
Figure 3B:
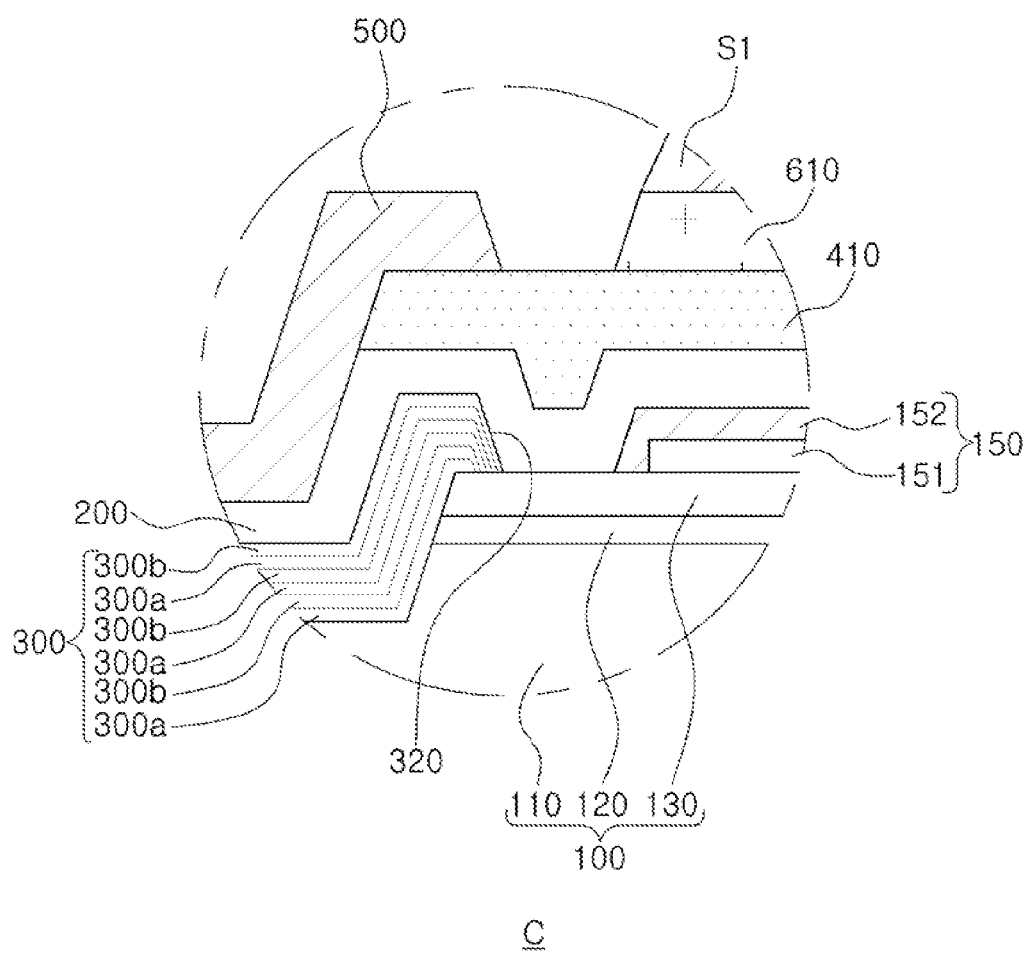
FIG. 3B is an enlarged view of a portion "C" of FIG. 3A.

Among the plurality of openings 310 and 320, the opening 310 disposed on the first contact electrode 140 may only expose the pad portion 141 among the pad portions 141 and the finger portions 142 in the first contact electrode 140. Thus, the plurality of openings 310 and 320 may be disposed in a position corresponding to the pad portion 141 on the first contact electrode 140. Such a disposition of the multilayer reflective structure 300 may be variously modified. FIG. 3A is a modified example of the semiconductor light emitting device of FIG. 2A, and FIG. 3B is an enlarged view of a portion "C" of FIG. 3A. The same reference numerals as those of FIGS. 1 through 2B denote the same elements, and thus, redundant descriptions will be omitted.

As illustrated in FIGS. 3A and 3B, a stacking order of the insulating layer 200 and the multilayer reflective structure 300 is interchanged, compared with the exemplary embodiment described above. Thus, the openings 310 and 320 are disposed in the multilayer reflective structure 300, and the first and second contact electrodes 140 and 150 are disposed in the openings 310 and 320. In addition, the openings 210 and 220 disposed on the insulating layer 200 may be provided in positions corresponding to each of the first and second contact electrodes 140 and 150 to partially expose the corresponding first and second contact electrodes 140 and 150. Since the insulating layer 200 is not disposed before the multilayer reflective structure 300 is disposed, adhesive properties of the multilayer reflective structure 300 may be reduced. However, since light may be reflected from the multilayer reflective structure 300 before passing through the insulating layer 200, an amount of light reflected from the multilayer reflective structure 300 may increase.

Figure 4A:
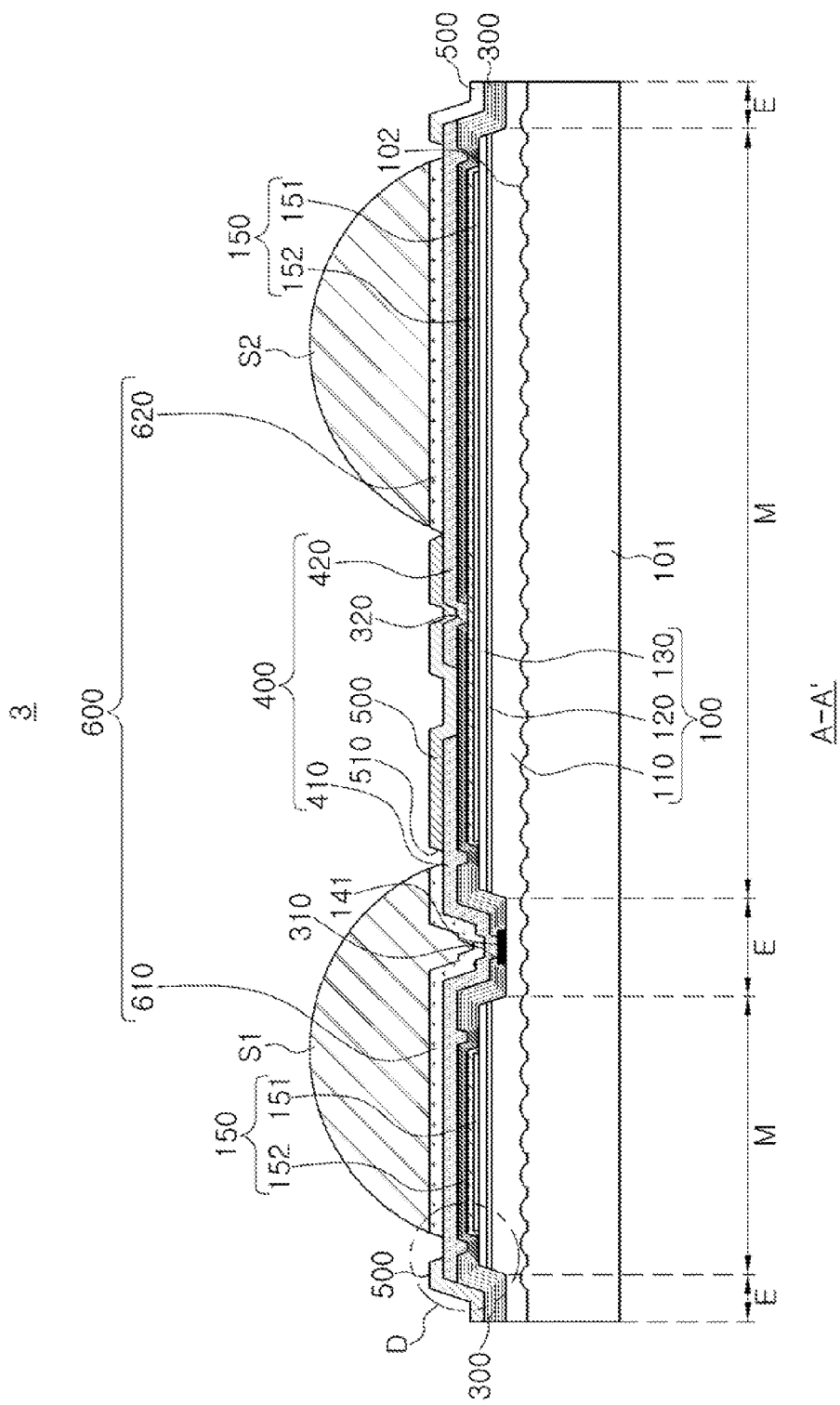
FIG. 4A is another modified example of the semiconductor light emitting device of FIG. 2A, according to an exemplary embodiment.
Figure 4B:
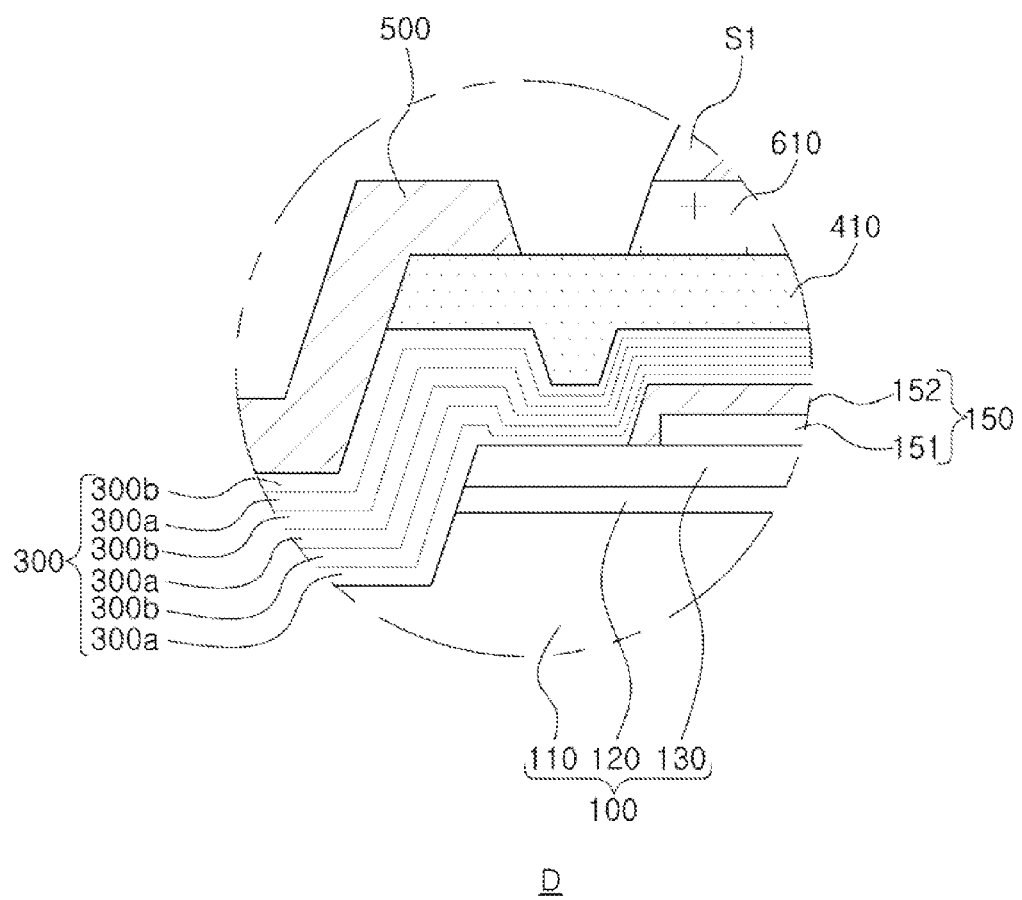
FIG. 4B is an enlarged view of a portion "D" of FIG. 4A.

FIG. 4A is another modified example of the semiconductor light emitting device of FIG. 2A, and FIG. 4B is an enlarged view of a portion "D" of FIG. 4A. The same reference numerals as those of FIGS. 1 through 2B denote the same elements, and thus, redundant descriptions will be omitted.

As illustrated in FIGS. 4A and 4B, only the multilayer reflective structure 300 is stacked without the insulating layer 200, compared with the exemplary embodiment described above. In this case, since the insulating layer 200 is not disposed before the multilayer reflective structure 300 is disposed, adhesive properties of the multilayer reflective structure 300 may be reduced. However, since light may be reflected from the multilayer reflective structure 300 before passing through the insulating layer 200, an amount of light reflected from the multilayer reflective structure 300 may increase. In addition, since the insulating layer is not disposed, the manufacturing process may be facilitated, compared with the exemplary embodiment described above.

Figure 5A:
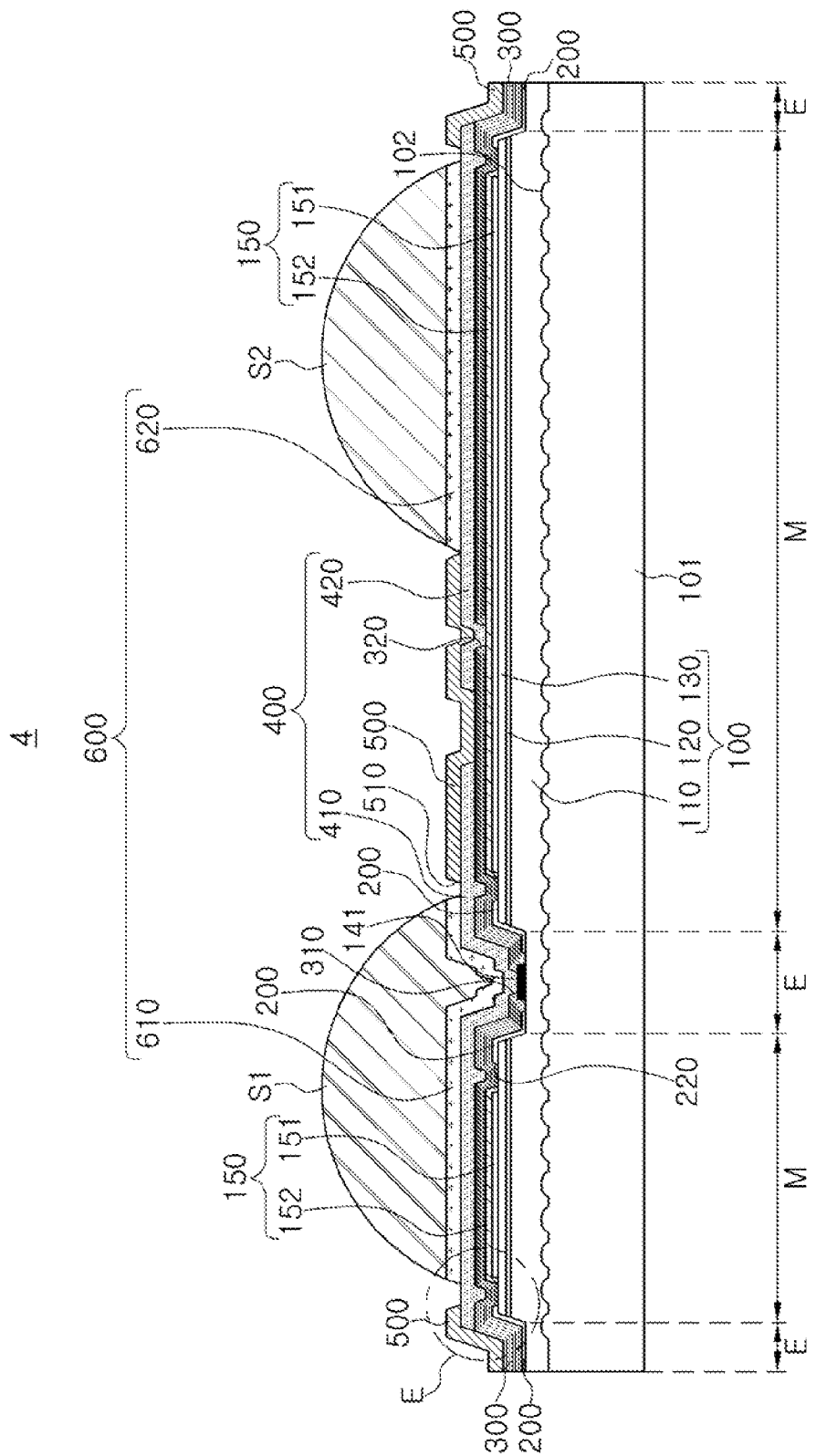
FIG. 5A is another modified example of the semiconductor light emitting device of FIG. 2A, according to an exemplary embodiment.
Figure 5B:
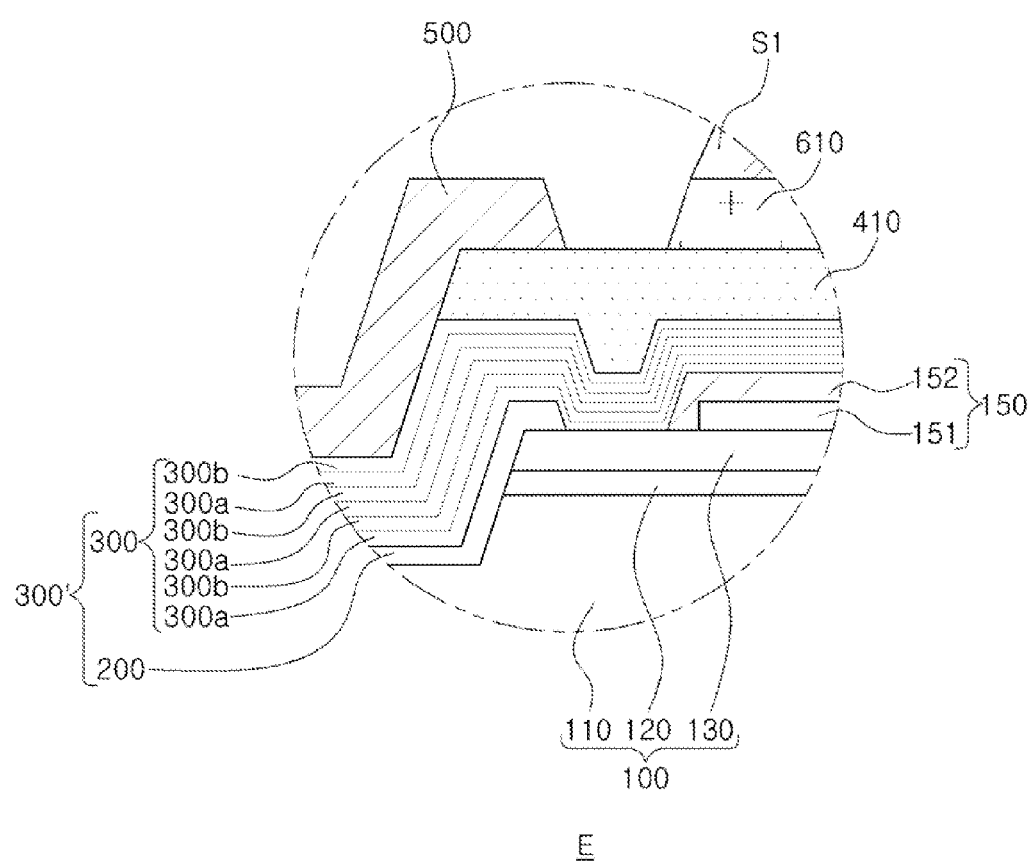
FIG. 5B is an enlarged view of a portion "E" of FIG. 5A.

FIG. 5A is another modified example of the semiconductor light emitting device of FIG. 2A, and FIG. 5B is an enlarged view of a portion "E" of FIG. 5A. The same reference numerals as those of FIGS. 1 through 2B denote the same elements, and thus, redundant descriptions will be omitted.

As illustrated in FIGS. 5A and 5B, the insulating layer 200 is thinner, compared with the exemplary embodiment described above. If the thickness of the insulating layer 200 is substantially equal to that of the second dielectric layer 300b of the multilayer reflective structure 300 and the insulating layer 200 is formed of the same material as that of the multilayer reflective structure 300, the insulating layer 200 may act as a single dielectric layer forming the multilayer reflective structure 300. Thus, the insulating layer 200 may perform the same function as that of the second dielectric layer 300b. In this case, since the insulating layer 200 and the multilayer reflective structure 300 constitute a single multilayer reflective structure 300', light reflectivity may be further enhanced.

As illustrated in FIG. 2A, the electrode pad 400 may be provided on the multilayer reflective structure 300, and may be electrically connected to the first and second conductivity-type semiconductor layers 110 and 130 through the plurality of openings 310 and 320, respectively.

As illustrated in FIG. 2A, the electrode pad 400 may be insulated from the first and second conductivity-type semiconductor layers 110 and 130 by the multilayer reflective structure 300 covering the entirety of an upper surface of the light emitting structure 100. The electrode pad 400 may be connected to the first contact electrode 140 and the second contact electrode 150 partially exposed through the plurality of openings 310 and 320 so as to be electrically connected to the first and second conductivity-type semiconductor layers 110 and 130.

Electrical connections between the electrode pad 400 and the first and second conductivity-type semiconductor layers 110 and 130 may be variously adjusted by the plurality of openings 310 and 320 provided in the multilayer reflective structure 300. For example, electrical connections between the electrode pad 400 and the first and second conductivity-type semiconductor layers 110 and 130 may be variously modified according to the number and positions of the plurality of openings 310 and 320.

The electrode pad 400 may include at least a pair of a first electrode pad 410 and a second electrode pad 420. That is, the first electrode pad 410 may be electrically connected to the first conductivity-type semiconductor layer 110 through the first contact electrode 140, and the second electrode pad 420 may be electrically connected to the second conductivity-type semiconductor layer 130 through the second contact electrode 150. In this case, the opening 310 exposing the first contact electrode 140 may be disposed in a position in which the opening 310 overlaps the first electrode pad 410, and the opening 320 exposing the second contact electrode 150 may be disposed in a position in which the opening 320 overlaps the second electrode pad 420. The first and second electrode pads 410 and 420 may be separated and electrically insulated from each other.

The electrode pad 400 may be formed of, for example, a material including at least one of gold (Au), tungsten (W), platinum (Pt), silicon (Si), iridium (Ir), silver (Ag), copper (Cu), nickel (Ni), titanium (Ti), chromium (Cr), and alloys thereof.

The first contact electrode 140, which is disposed in a position in which the second electrode pad 420 is positioned thereon to overlap the second electrode pad 420, may need to be prevented from being electrically connected to the second electrode pad 420. To this end, the multilayer reflective structure 300 may not have the opening 310 exposing the pad portion 141 of the first contact electrode 140 on the position overlapping the second electrode pad 420.

As illustrated in FIG. 1, when the first contact electrode 140 includes three pad portions 141 and two finger portions 142, the openings 310 exposing the pad portions 141 may only be provided on the two pad portions 141 disposed in positions in which the two pad portions 141 overlap the first electrode pad 410, and may not be provided on the other pad portion 141 disposed in a position in which the pad portion 141 overlaps the second electrode pad 420. Thus, the pad portion 141 of the first contact electrode 140 positioned below the first electrode pad 410 may be connected to the first metal electrode pad 410 through the opening 310, but since the opening 310 is not provided on the pad portion 141 positioned below the second electrode pad 420, the pad portion 141 and the second electrode pad 420 may be electrically insulated from one another. As a result, through the arrangement of the plurality of openings 310 and 320 respectively exposing the first contact electrode 140 and the second contact electrode 150, the first electrode pad 410 may be connected to the first contact electrode 140 and the second electrode pad 420 may be connected to the second contact electrode 150.

A passivation layer 500 may be provided on the electrode pad 400 and cover the entirety of the electrode pad 400. The passivation layer 500 may include a bonding region 510 partially exposing the electrode pad 400.

A plurality of bonding regions 510 may be provided to partially expose the first electrode pad 410 and the second electrode pad 420. In this case, some of the plurality of bonding regions 510 may not overlap some of the plurality of openings 310 and 320 of the multilayer reflective structure 300. For example, as illustrated in FIG. 2A, some of the bonding regions 510 partially exposing the second electrode pad 420 may not overlap some of the opening 320 partially exposing the second contact electrode 150. That is, the bonding region 510 is not positioned above the opening 320 in a vertical direction. The bonding region 510 partially exposing the first electrode pad 410 may partially overlap the opening 310 partially exposing the first contact electrode 140.

In the present exemplary embodiment, two bonding regions 410 are disposed to be parallel, but the number and dispositional form of the bonding regions 510 are not limited thereto and may be variously modified.

The passivation layer 500 may be formed of the same material as that of the multilayer reflective structure 300.

The passivation layer 500 may further include open regions partially exposing the first and second electrode pads 410 and 420, similarly to the bonding regions 510. The open regions 510 may be provided as regions connected to a probe pin (not shown) in order to determine whether the semiconductor light emitting device properly operates before being mounted.

The solder pads 600 may be disposed in the bonding regions 510. The solder pads 600 may include a first solder pad 610 and a second solder pad 620 to be respectively connected to the first and second electrode pads 410 and 420 partially exposed through the bonding regions 510. The solder pads 600 may be electrically connected to the first conductivity-type semiconductor layer 110 and the second conductivity-type semiconductor layer 130 through the electrode pads 400. The solder pads 600 may be formed of a material including at least one of materials, such as nickel (Ni), gold (Au), or copper (Cu), and alloys thereof.

The first solder pad 610 and the second solder pad 620 may be, for example, under bump metallurgy (UBM) layers.

A single first solder pad and a single second solder pad or a plurality of first solder pads and a plurality of second solder pads may be provided.

A modified example of the solder pads 600 will be described with reference to FIG. 13. Only a modified example of the second solder pad 620 is illustrated in FIG. 13, but the first solder pad 610 may also be modified in the same manner.

Figure 13:
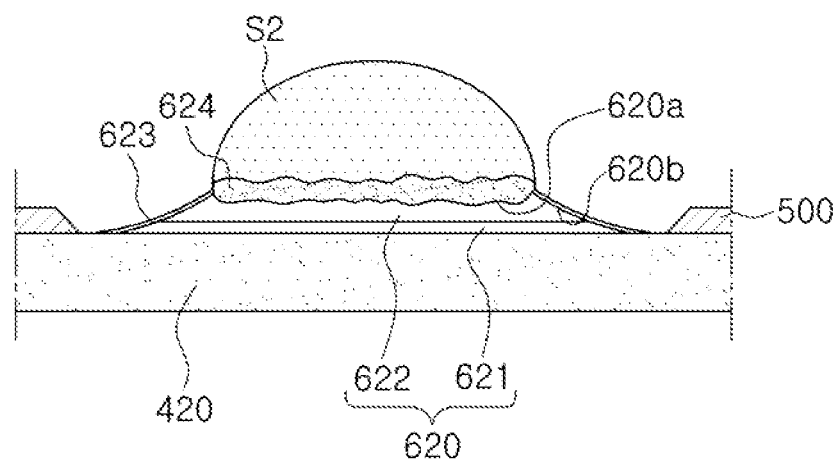
FIG. 13 is a view illustrating a modified example of a solder pad of FIG. 2A, according to an exemplary embodiment.

FIG. 13 is a view illustrating a modified example of the solder pad 620 of FIG. 2A.

The second solder pad 620 may increase interface bonding force between the second electrode pad 420 of the semiconductor device and a solder bump S2 and provide an electrical path. In addition, the second solder pad 620 may prevent solder from being spread to an electrode during a reflow process. That is, the second solder pad 620 may prevent a component of the solder from permeating into the second electrode pad 420.

The second solder pad 620 may include a first surface 620a positioned on the opposite side of the surface of the second electrode pad 420 and disposed to be in contact with an intermetallic compound (IMC) 624 above the second electrode pad 420 and a second surface 620b extending from the edge of the first surface 620a and connected to the second electrode pad 420.

The first surface 620a may have an overall flat structure, and define an upper surface of the second solder pad 620. The second surface 620b may have a structure gently sloped toward the second electrode pad 420 from the first surface 620a, and define the side of the second solder pad 620.

The second solder pad 620 may be formed of a metal for forming an electrical connection with the second electrode pad 420.

For example, the second solder pad 620 may have a multilayer structure including a titanium (Ti) layer 621 in contact with the second electrode pad 420 and a nickel (NI) layer 622 disposed on the titanium (Ti) layer 621. In addition, although not shown, the second solder pad 620 may have a multilayer structure including a copper layer disposed on the titanium layer 621, instead of the nickel layer 622.

In the present exemplary embodiment, the second solder pad 620 has the multilayer structure of titanium (Ti) and nickel (Ni), but is not limited thereto. For example, the second solder pad 620 may have a multilayer structure including a chromium (Cr) layer in contact with the second electrode pad 420 and a nickel (Ni) layer disposed on the chromium layer or a multilayer structure including a chromium layer and a copper (Cu) layer disposed on the chromium layer.

In addition, in the present exemplary embodiment, the second solder pad 620 has a multilayer structure, but is not limited thereto. For example, the second solder pad 620 may have a monolayer structure including a nickel layer or a copper layer.

The second solder pad 620 may be formed through a process such as sputtering, e-beam deposition, or plating.

The intermetallic compound (IMC) 624 may be formed on a first surface 620a of the second solder pad 620. The intermetallic compound (IMC) 624 may be formed during a reflow process of forming the solder bump S2. The intermetallic compound (IMC) 624 may be formed as a tin (Sn) component of the solder reacts with the metal, for example, nickel (Ni), of the second solder pad 620, and may form a binary-system tin-nickel alloy.

The solder bump S2 may be bonded to the second solder pad 620 by the medium of the intermetallic compound (IMC) 624. That is, the solder bump S2 may be firmly bonded to the second solder pad 620 by the means of the intermetallic compound (IMC) 624 serving as an adhesive.

The solder bump S2 may be formed by reflowing solder placed on the second solder pad 620. As the solder, for example, general SAC305 ($Sn_{96.5}Ag_{3.0}Cu_{0.5}$) may be used.

A barrier layer 623 may be formed to cover a second surface 620b of the second solder pad 620. The barrier 623 may minimize wettability with respect to the solder bump S2, blocking spreading of the intermetallic compound (IMC) 624 and the solder bump S2 to the second surface 620b. This may be achieved by forming the barrier layer 623 with a material having sufficiently minimized wettability with respect to the intermetallic compound (IMC) 624 and the solder bump S2.

The barrier layer 623 may be an oxide layer containing at least one of elements of the second solder pad 620. For example, the barrier layer 623 may be an oxide film containing at least one element among nickel (Ni) and copper (Cu).

The barrier layer 623 may be formed by oxidizing the second surface 620b of the second solder pad 620 by performing, for example, thermal oxidation or plasma oxidation.

The passivation layer 500 may be disposed around the second solder pad 620 on the second electrode pad 420. The passivation layer 500 may be formed of, for example, $SiO_2$.

The passivation layer 500 may be spaced apart from the second solder pad 620 on the second electrode pad 400 by a predetermined interval so as not to be in contact with the second solder pad 620. The passivation layer 500 may have a thin film structure and have a height lower than that of the second solder pad 620. That is, with respect to the surface of the second electrode pad 420, the first surface 620a of the second solder pad 620 may be disposed in a position higher than an upper surface of the passivation layer 500.

In the present exemplary embodiment, the passivation layer 500 is disposed around the second solder pad 620, but without being limited thereto, the passivation layer 500 may be selectively provided. Thus, in another exemplary embodiment, the passivation layer 500 may be omitted.

In the present exemplary embodiment, one first solder pad 610 and one second solder pad 620 are provided, but the number of the first solder pad 610 and one second solder pad 620 is not limited thereto. The number and dispositional structure of the first solder pad 610 and the second solder pad 620 may be adjusted according to the bonding region 510. However, the first solder pad 610 and the second solder pad 620 may be determined to have substantially the same area.

Solder bumps S1 and S2 are disposed on the first solder pad 610 and the second solder pad 620, and heights of the solder bumps S1 and S2 tend to increase in proportion to the areas thereof. Thus, if the areas of the first solder pad 610 and the second solder pad 620 are different, heights of the solder bumps S1 and S2 respectively disposed on the first solder pad 610 and the second solder pad 620 may become different, causing a cold-solder joint phenomenon on the side where the height of the solder bumps S1 and S2 is lower when the semiconductor light emitting device 1 is mounted on a package board in a follow-up process, which leads to a problem in which the semiconductor light emitting device 1 may not be turned on.

The solder bumps S1 and S2 may be respectively disposed on the first and second solder pads 610 and 620 and used when the semiconductor light emitting device 1 is mounted on a package board in a follow-up process. The solder bumps S1 and S2 are conductive adhesives for mounting the semiconductor light emitting device 1 in a flip-chip manner on a package board. Sn solder may be used as the solder bumps S1 and S2, and a material, such as a slight amount of silver (Ag) or copper (Cu), may be contained in the Sn solder.

As described above, in the semiconductor light emitting device 1, light moving in the opposite direction of the substrate 101, among light emitted from the active layer 120, may be redirected toward the substrate 101 to enhance light extraction efficiency, and electrical insulation may be secured between the contact electrodes and the electrode pads.

Figure 6A:
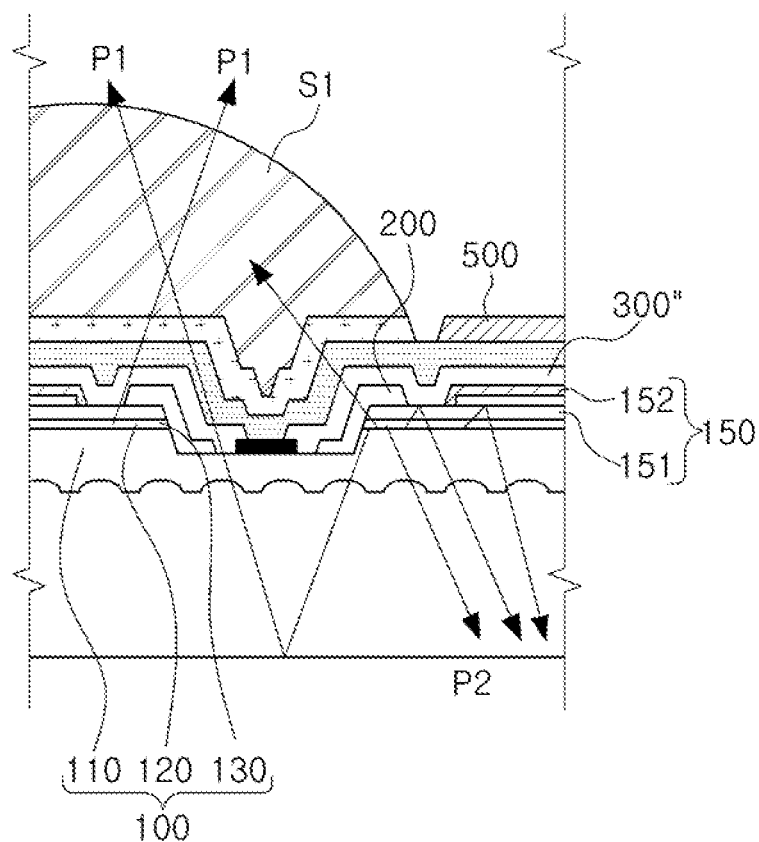
FIG. 6A is a view illustrating an optical path of a comparative example.

This will be described in detail with reference to FIGS. 6A and 6B. FIG. 6A is a view illustrating an optical path of a Comparative Example, and FIG. 6B is a view illustrating an optical path of an exemplary embodiment.

In Comparative Example of FIG. 6A, a general insulating layer 300", instead of the multilayer reflective structure 300 according to the present exemplary embodiment, is disposed. In the case of a flip-chip type semiconductor light emitting device, light irradiated to an irradiation surface is emitted in a P2 direction, and light moves toward a direction P1 opposite to the direction P2 in a region such as an upper portion of the insulating layer 300".

This appears intensively in regions such as an etched lateral region of the light emitting structure 100 and an edge region of the light emitting device. Such regions accounts for about 22% of the planar area of the semiconductor light emitting device, and since light is not oriented toward the irradiation surface in these regions, external light extraction efficiency of the semiconductor light emitting device is reduced.

Figure 6B:
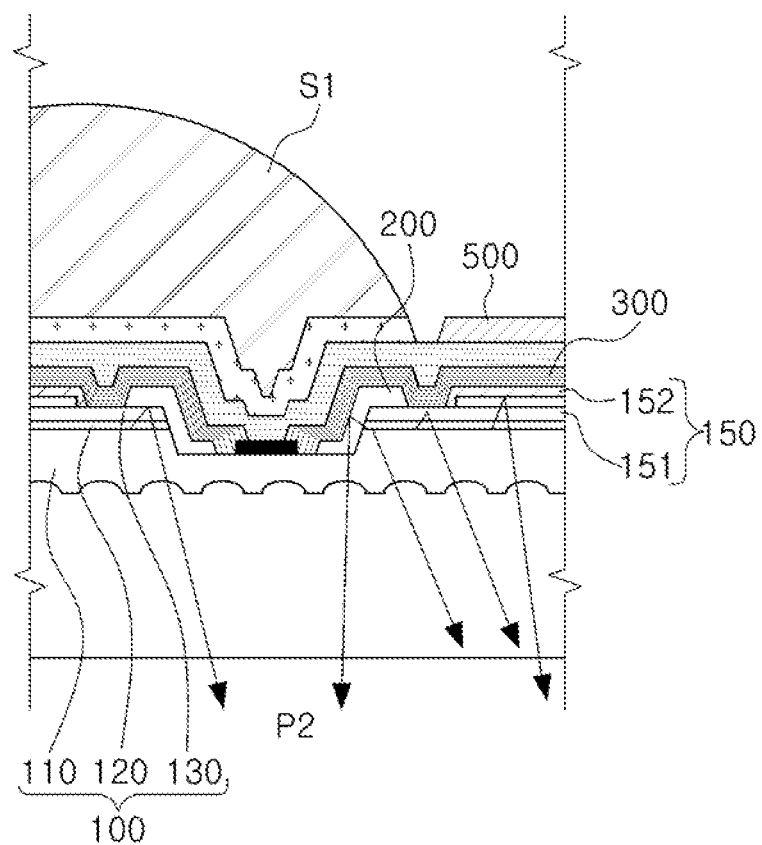
FIG. 6B is a view illustrating an optical path of an exemplary embodiment.

In the present exemplary embodiment, as illustrated in FIG. 6B, the multilayer reflective structure 300 is disposed in the region to fundamentally block light moving in the direction P1 as in Comparative Example. Thus, an amount of light irradiated to the irradiation surface may increase, thereby increasing luminance. In an experiment, the multilayer reflective structure 300 was formed of sixteen dielectric layers and luminance of light irradiated to the irradiation surface and that of Comparative Example were compared, and results in which luminance increased by 2% in the present exemplary embodiment were obtained.

In addition, since the multilayer reflective structure 300 formed by alternately stacking layers formed of an insulating material is disposed between the first electrode pad 410 and the second contact electrode 150, which are disposed above and below the multilayer reflective structure 300, electrical insulation may be more effectively made between the first electrode pad 410 and the second contact electrode 150. Thus, in the present exemplary embodiment, luminance of the semiconductor light emitting device may be enhanced through the multilayer reflective structure 300, and electrical insulation may be secured between the first electrode pad 410 and the second contact electrode 150.

Hereinafter, a process of manufacturing the semiconductor light emitting device of FIG. 1 will be described. FIGS. 7A through 12B are views illustrating processes of manufacturing a semiconductor light emitting device according to an exemplary embodiment. In FIGS. 7A through 12B, reference numerals the same as those of FIGS. 1 through 2A denote the same members, and thus, redundant descriptions thereof will be omitted.

Figure 7A:
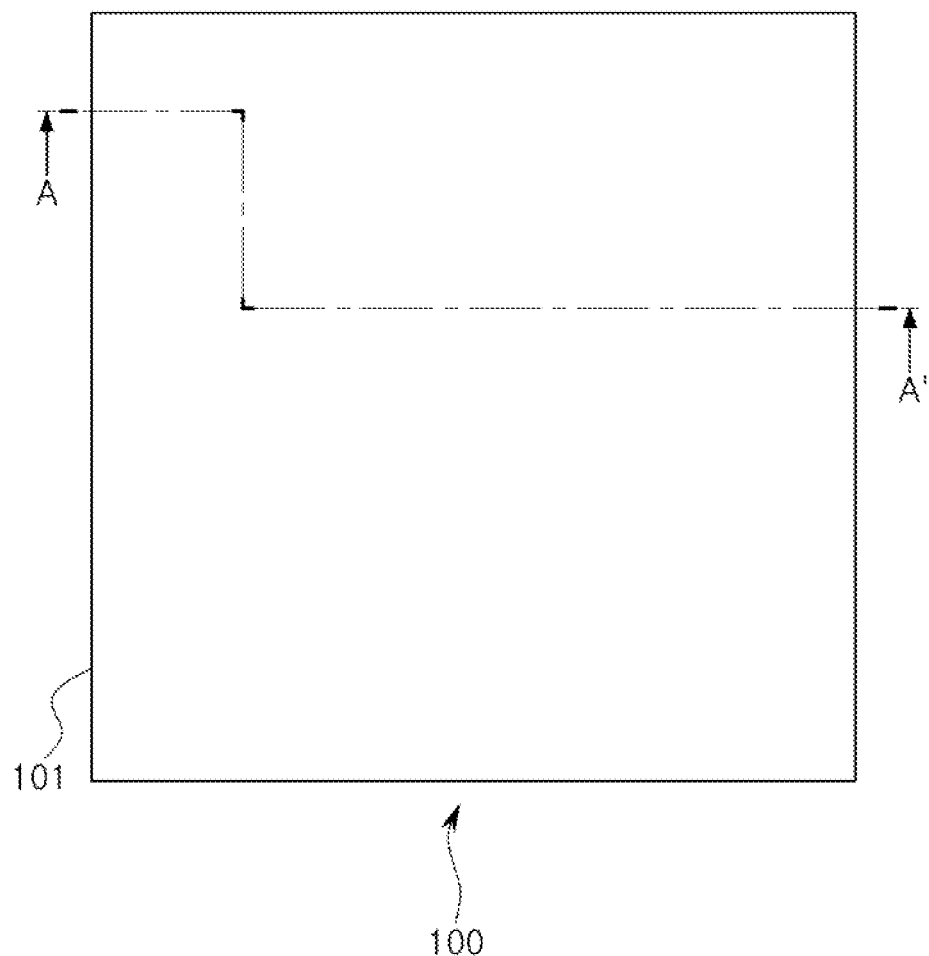

Referring to FIGS. 7A and 7B, FIG. 7A is a plan view of a light emitting structure 100 formed on a substrate 101, and FIG. 7B is a cross-sectional view taken along line A-A' of FIG. 7A. FIGS. 8A through 12B are illustrated in the same manner.

The irregular pattern 102 may be formed on the substrate 101. However, the irregular pattern 102 may be omitted according to exemplary embodiments. A substrate formed of a material, such as sapphire, Si, SiC, MgAl$_2$O$_4$, MgO, LiAlO$_2$, LiGaO$_2$, or GaN, as described above, may be used as the substrate 101.

A first conductivity-type semiconductor layer 110, an active layer 120, and a second conductivity-type semiconductor layer 130 may be sequentially grown on the substrate 101 using metal-organic chemical vapor deposition (MOCVD), hydride vapor phase epitaxy (HVPE), or molecular beam epitaxy (MBE) to form the light emitting structure 100 having a stacked structure of a plurality of semiconductor layers. Here, the first conductivity-type semiconductor layer 110 and the second conductivity-type semiconductor layer 130 may be an n-type semiconductor layer and a p-type semiconductor layer 130, respectively. In the light emitting structure 100, the positions of the first conductivity-type semiconductor layer 110 and the second conductivity-type semiconductor layer 130 may be interchanged, and the second conductivity-type semiconductor layer 130 may first be formed on the substrate 101.

Figure 8A:
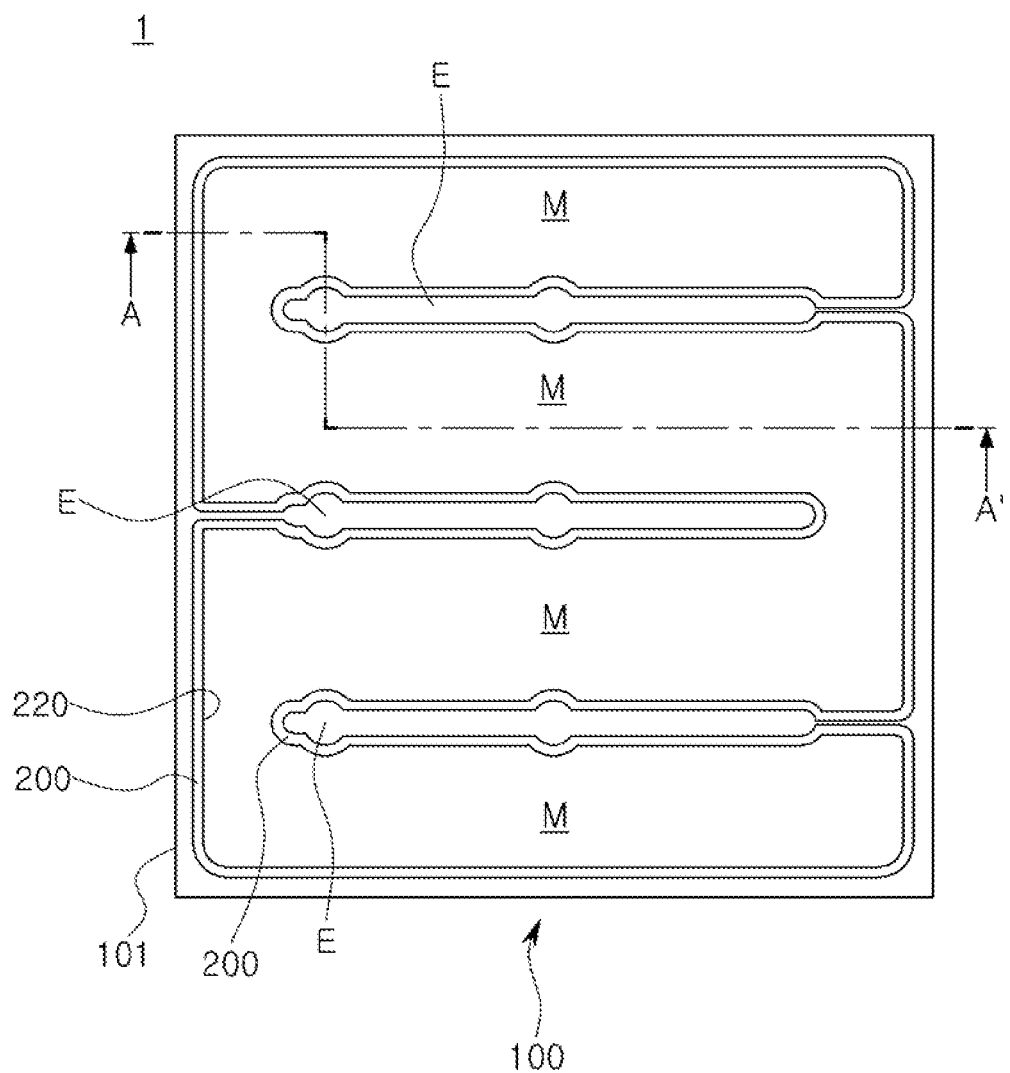
Figure 8B:
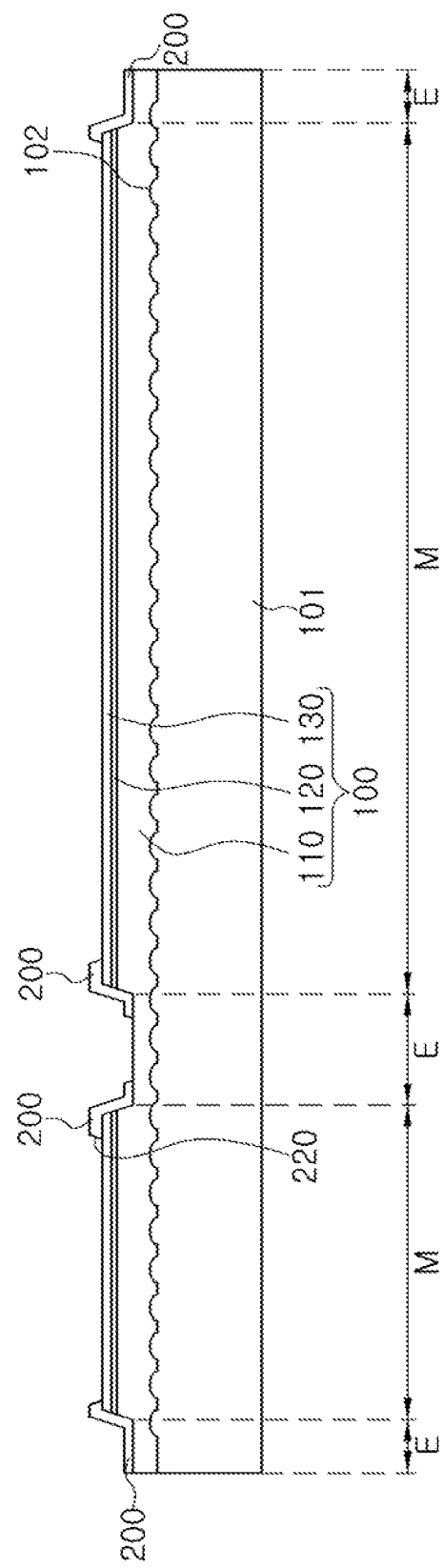

Referring to FIGS. 8A and 8B, some of the second conductivity-type semiconductor layer 130, the active layer 120, and the first conductivity-type semiconductor layer 110 may be etched to expose at least some of the first conductivity-type semiconductor layer 110. Accordingly, etched regions E and a plurality of mesa regions M partially demarcated by the etched regions E may be formed.

During the etching process, a mask layer may be formed in a region excluding a region in which the first conductivity-type semiconductor layer 110 is exposed, and wet etching or dry etching may be subsequently performed to form the mesa regions M. According to exemplary embodiments, the etching process may be performed such that the first conductivity-type semiconductor layer 110 is not etched and only some of an upper surface thereof is exposed.

An insulating layer 200 may be formed on a lateral surface of the mesa region M exposed to the etched region E through the etching process. The insulating layer 200 may be formed to cover the lateral surface of the mesa region M including an edge of an upper surface of the mesa region M and some of a bottom surface of the etched region E. Thus, the active layer 120 exposed to the etched region E may be covered by the insulating layer 200 so as not to be exposed outwardly. However, the insulating layer 200 is selectively formed and may be omitted according to exemplary embodiments.

Figure 9A:
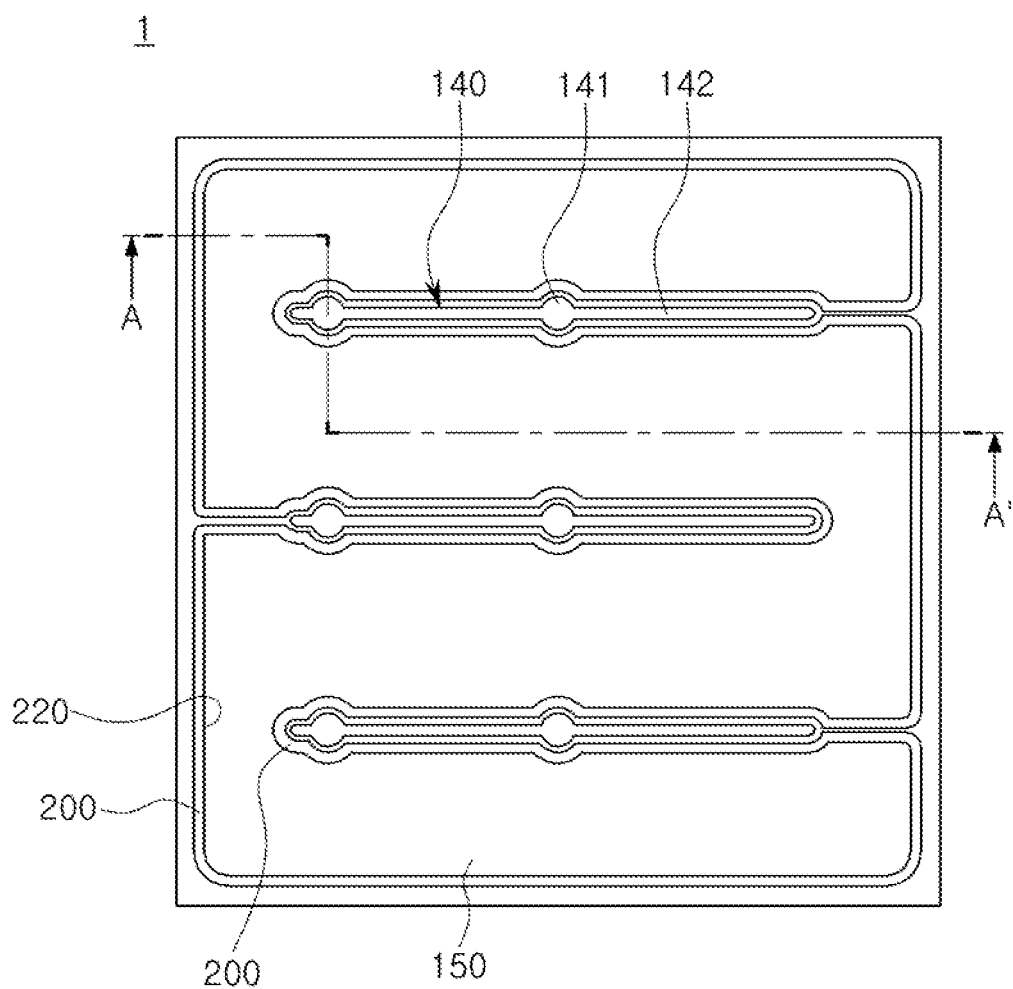
Figure 9B:
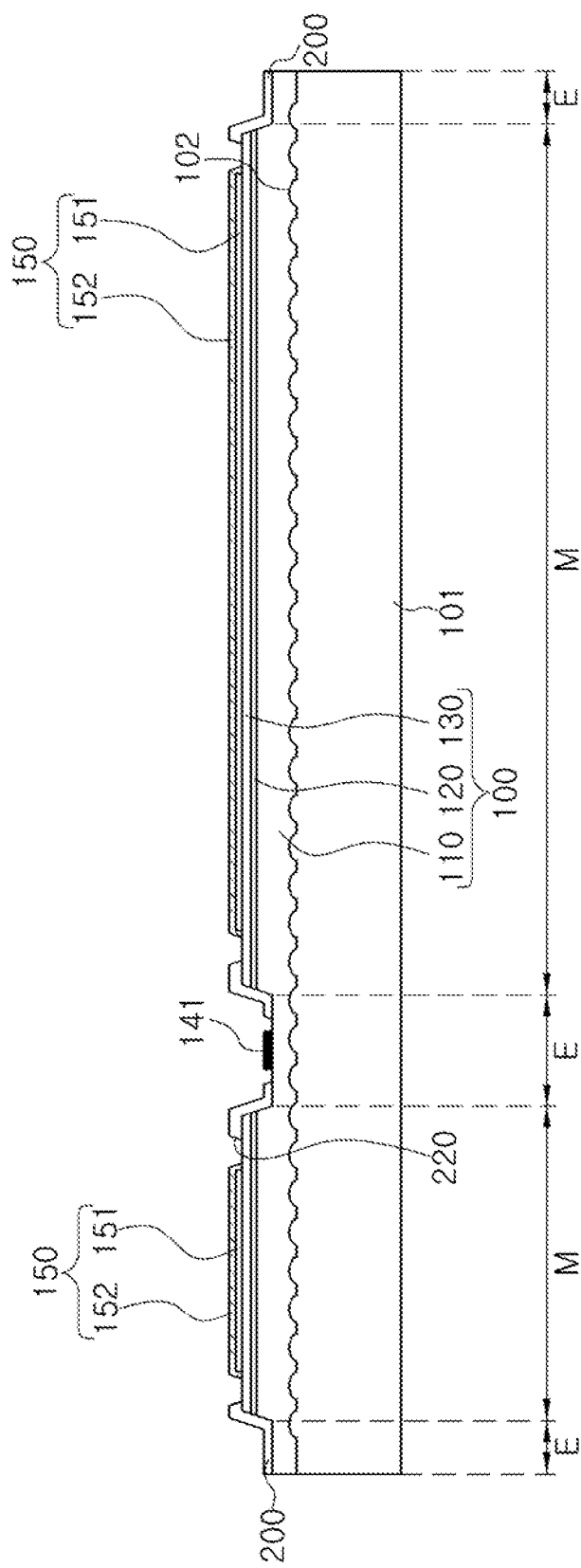

Referring to FIGS. 9A and 9B, a first contact electrode 140 and a second contact electrode 150 may be formed in the etched region E and the mesa region M, respectively. The first contact electrode 140 may extend along the etched region E and may be connected to the first conductivity-type semiconductor layer 110 defining a bottom surface of the etched region E. The second contact electrode 150 may be connected to the second conductivity-type semiconductor layer 130.

The first contact electrode 140 may include a plurality of pad portions 141 and a plurality of finger portions 142 extending from the pad portions 141. The second contact electrode 150 may include a reflective metal layer 151 and a coating metal layer 152 covering the reflective metal layer 151.

Figure 10A:
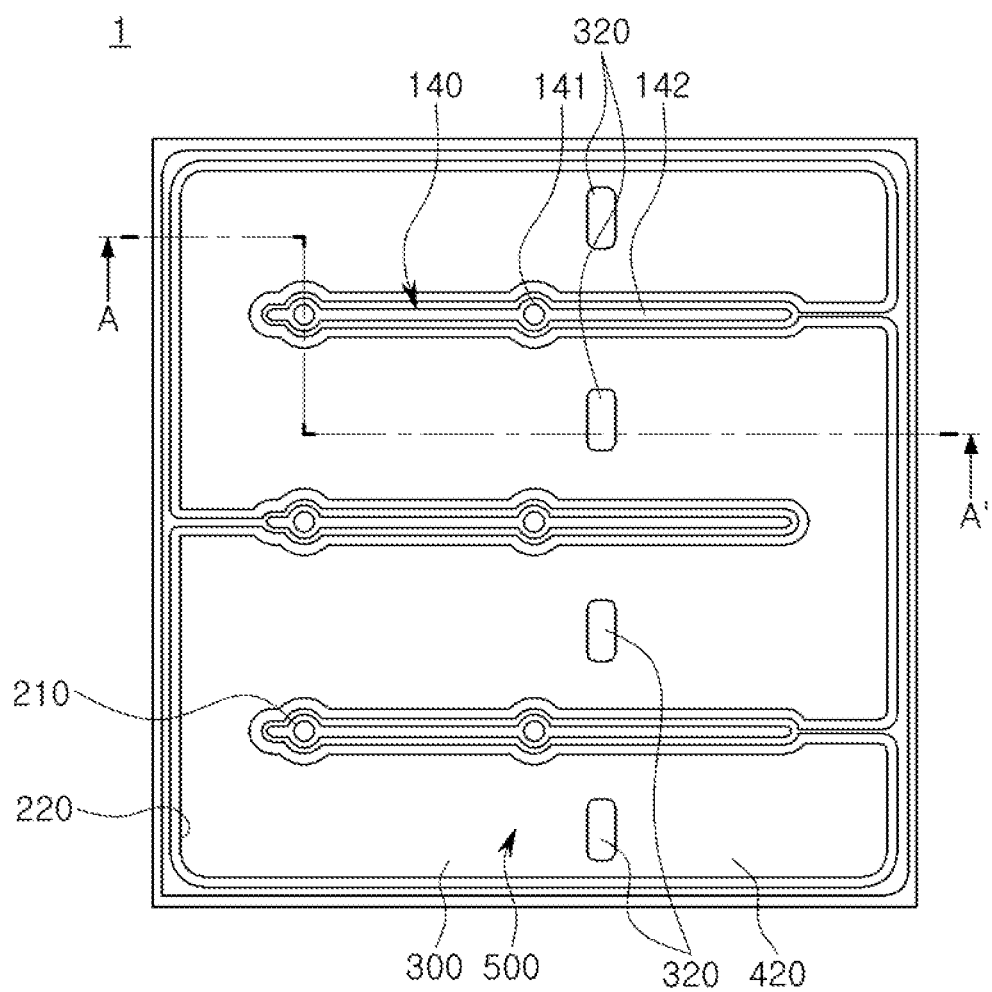
Figure 10B:
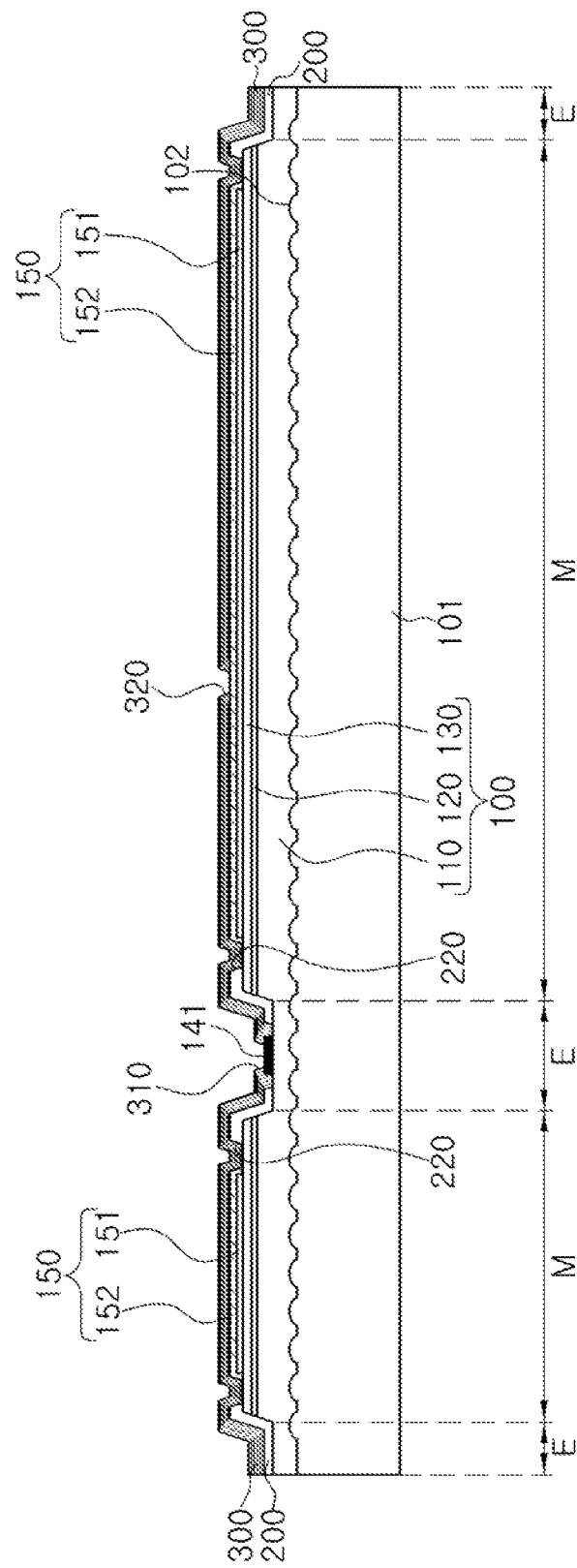

Referring to FIGS. 10A and 10B, a structure in which the multilayer reflective structure 300 covers the surface of the light emitting structure 100 may be provided.

For example, the multilayer reflective structure 300 may include a silicon oxide or a silicon nitride and may be formed by repeatedly depositing materials, such as SiO$_2$, SiN, SiO$_x$N$_y$, TiO$_2$, Si$_3$N$_4$, Al$_2$O$_3$, TiN, AlN, ZrO$_2$, TiAlN, or TiSiN. This process may be performed using MOCVD, HVPE, MBE, and the like.

The multilayer reflective structure 300 may be provided as a multilayer structure and have a structure in which a plurality of dielectric layers having different refractive indices are alternately stacked. The multilayer reflective structure 300 may be provided as a distributed Bragg reflector (DBR) by appropriately adjusting the refractive indices and thicknesses of the alternately stacked layers.

The first contact electrode 140 and the second contact electrode 150 may be partially exposed on the first and second conductivity-type semiconductor layers 110 and 130 through the plurality of openings 310 and 320.

Figure 11A:
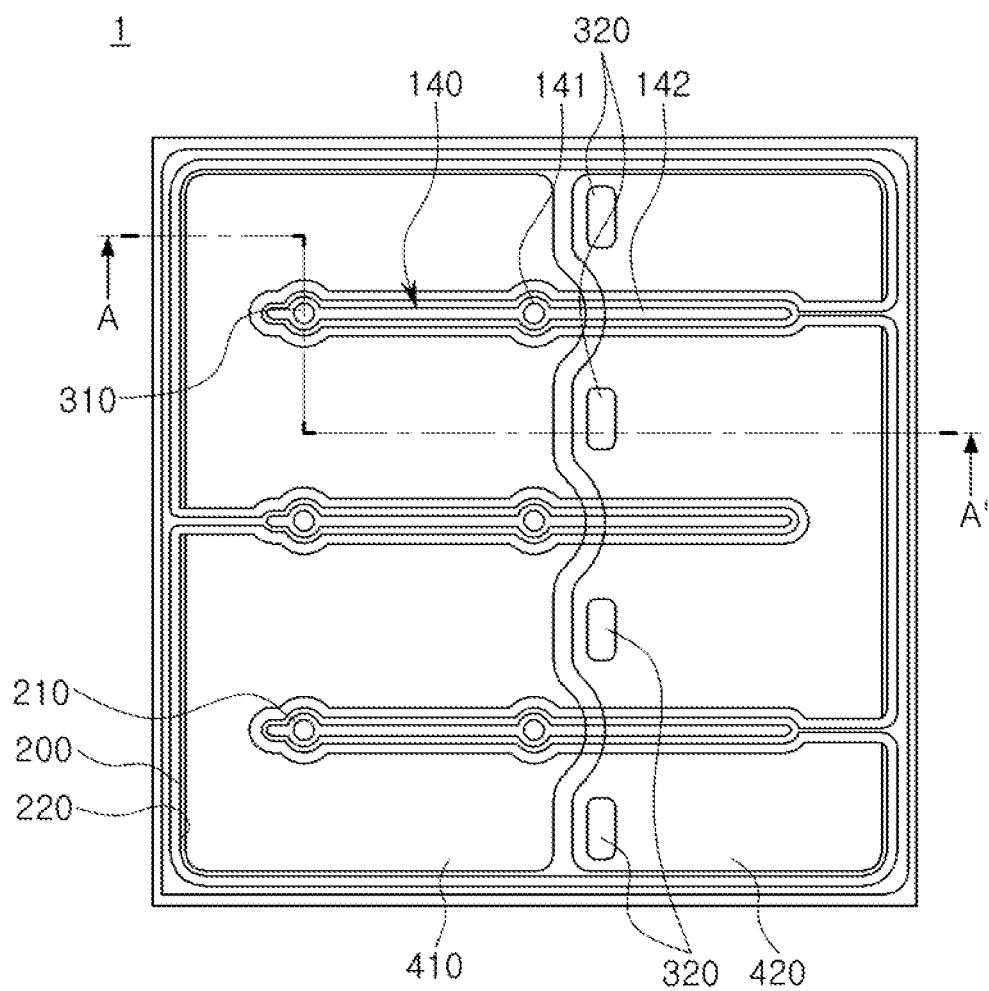
Figure 11B:
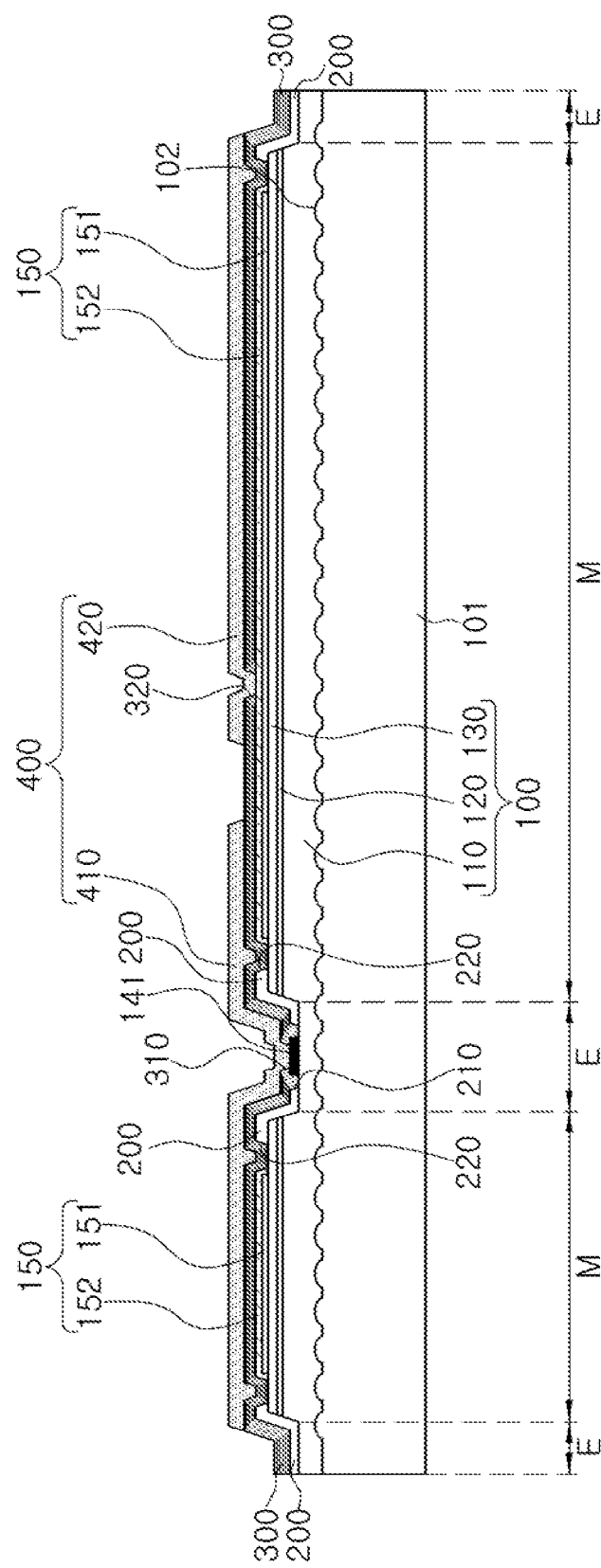

Referring to FIGS. 11A and 11B, an electrode pad 400 may be formed on the multilayer reflective structure 300. The electrode pad 400 may be connected to the first and second contact electrodes 140 and 150 exposed through the openings 310 and 320 so as to be electrically connected to the first conductivity-type semiconductor layer 110 and the second conductivity-type semiconductor layer 130, respectively.

The electrode pad 400 may be provided as at least a pair in order to electrically insulate the first conductivity-type semiconductor layer 110 and the second conductivity-type semiconductor layer 130. That is, a first electrode pad 410 may be electrically connected to the first conductivity-type semiconductor layer 110 through the first contact electrode 140, a second electrode pad 420 may be electrically connected to the second conductivity-type semiconductor layer 130 through the second contact electrode 150, and the first and second electrode pads 410 and 420 may be separated to be electrically insulated.

Figure 12A:
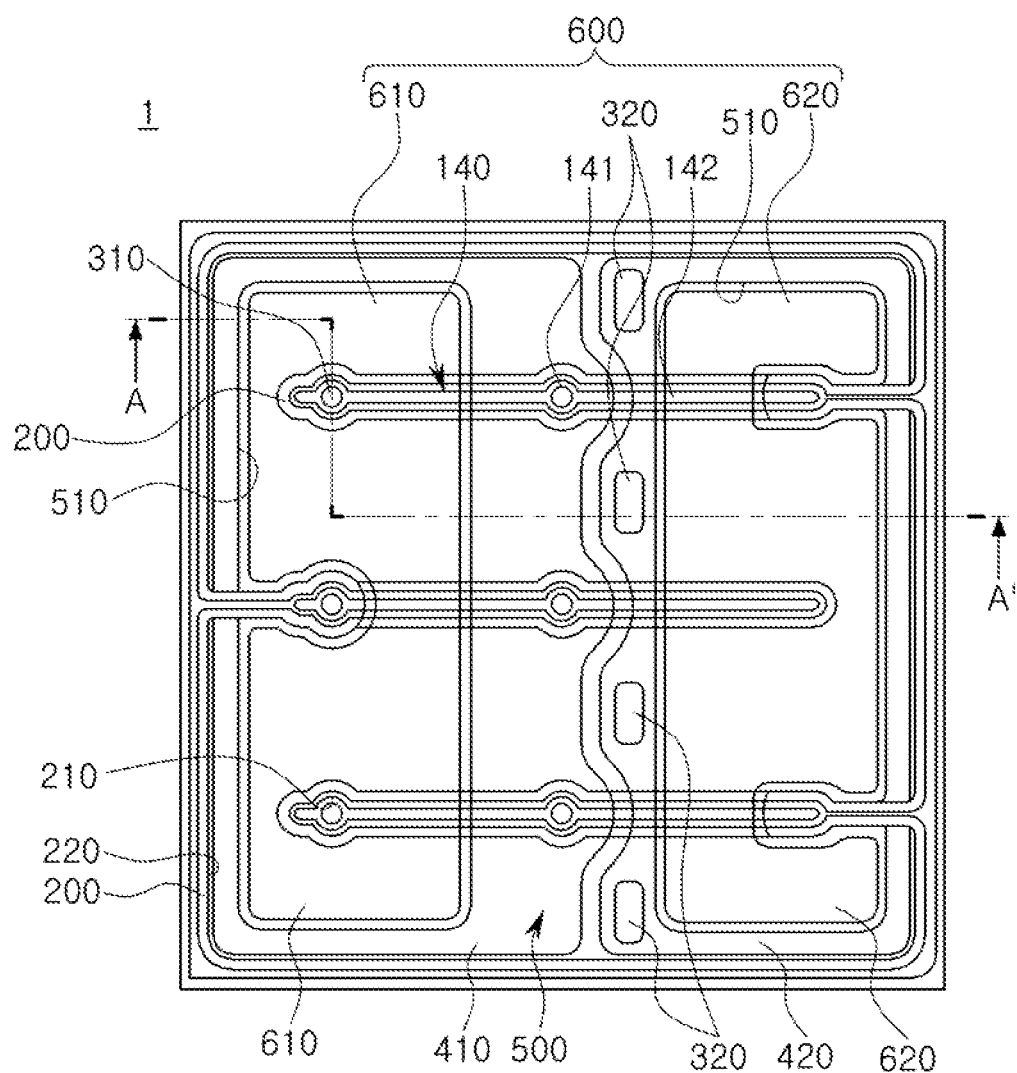
Figure 12B:
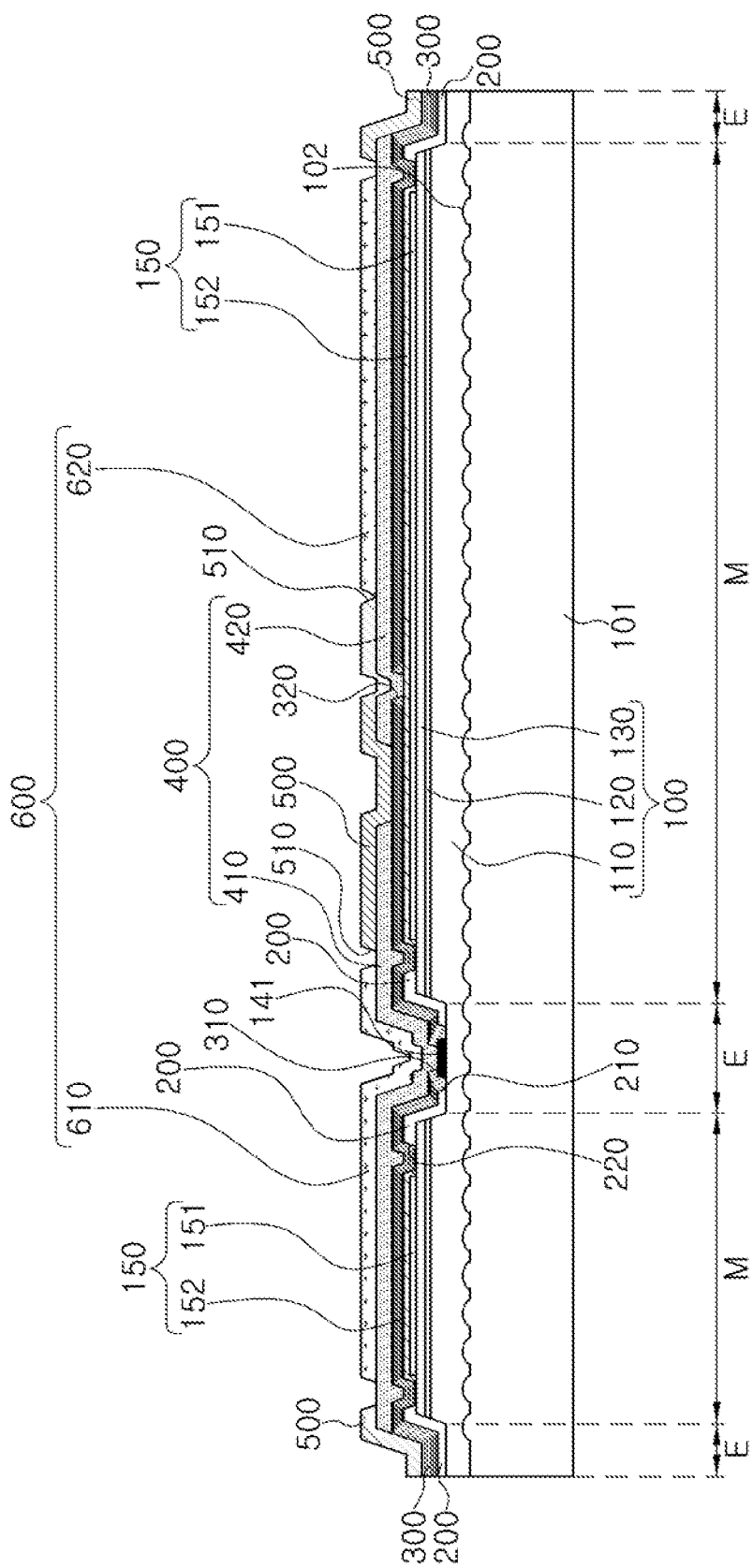

Referring to FIGS. 12A and 12B, a passivation layer 500 may be formed on the electrode pad 400. The passivation layer 500 may partially expose the electrode pad 400 through a bonding region 510.

The bonding region 510 may be provided in plural to partially expose the first electrode pad 410 and the second electrode pad 420, respectively. In this case, some of the plurality of bonding regions 510 may be disposed not to overlap the plurality of openings 310 and 320 of the multilayer reflective structure 300. For example, as illustrated in FIG. 12A, some of the bonding regions 510 partially exposing the second electrode pad 420 may not overlap with the opening 320 partially exposing the second contact electrode 150, among the plurality of openings 310 and 320. That is, the bonding region 510 is not positioned above the opening 320 in a vertical direction.

The passivation layer 500 may be formed of the same material as that of the multilayer reflective structure 300.

A solder pad 600 including a first solder pad 610 and a second solder pad 620 may be formed on the first and second electrode pads 410 and 420 partially exposed through the bonding region 510. The first solder pad 610 and the second solder pad 620 may be, for example, under-bump metallurgy (UBM) layers. The number and dispositional structure of the first solder pad 610 and the second solder pad 620 may be variously modified, without being limited thereto.

The passivation layer 500 may further include open regions partially exposing the first and second electrode pads 410 and 420, similar to the bonding region 510. The open regions serve to allow for determining operability of a manufactured semiconductor light emitting device before a product containing the same is released. In this case, an operation of the semiconductor light emitting device may be determined by connecting a probe pin (not shown) to the first and second electrode pads 410 and 420 exposed to the open regions and supplying driving power thereto.

Figure 14A:
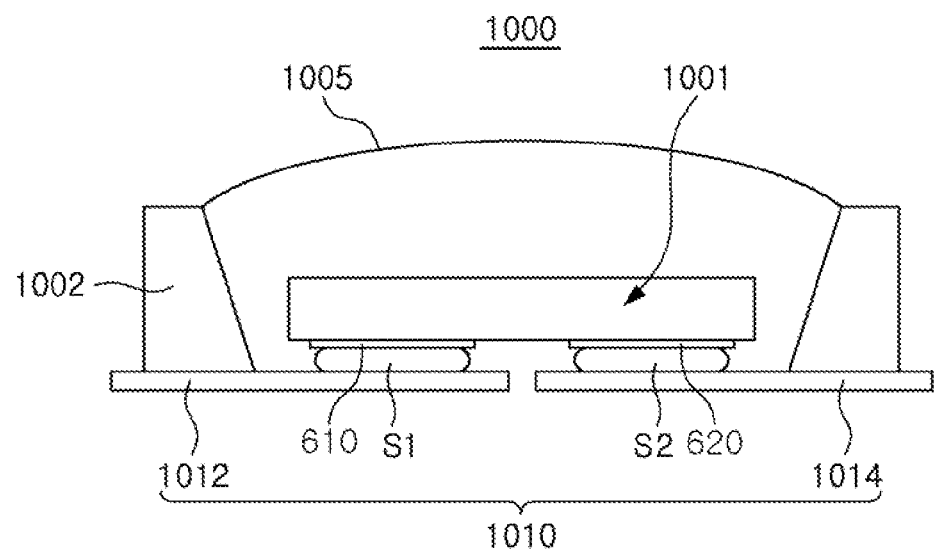
FIGS. 14A and 14B are cross-sectional views illustrating examples of a semiconductor light emitting device package employing a semiconductor light emitting device, according to an exemplary embodiment.
Figure 14B:
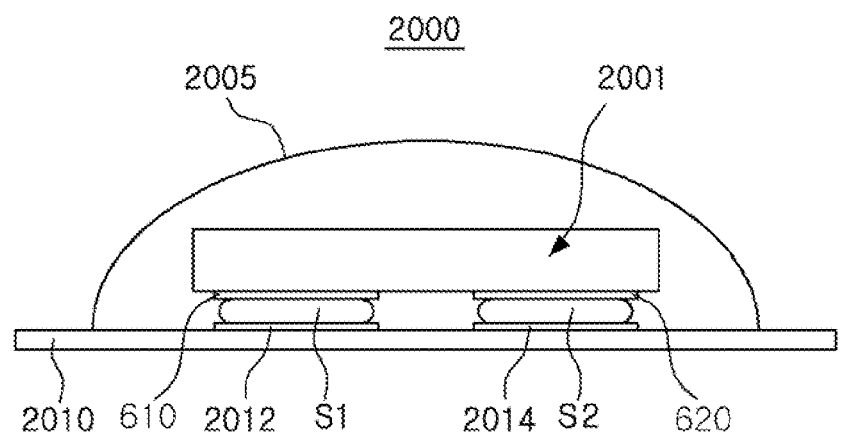

FIGS. 14A and 14B are cross-sectional views illustrating examples of a semiconductor light emitting device package employing a semiconductor light emitting device according to an exemplary embodiment.

Referring to FIG. 14A, a semiconductor light emitting device package 1000 may include a semiconductor light emitting device 1001 as a light source, a package body 1002, a pair of lead frames 1010, and an encapsulant 1005. The semiconductor light emitting device 1001 may be the semiconductor light emitting device 1 of FIG. 1 and a detailed description thereof will be omitted.

The semiconductor light emitting device 1001 may be mounted on the lead frames 1010 and electrically connected to the lead frames 1010 through a conductive bonding material. As the conductive bonding material, for example, solder bumps S1 and S2 including Sn may be used.

The pair of lead frames 1010 may include a first lead frame 1012 and a second lead frame 1014. A first solder pad 610 and a second solder pad 620 of the semiconductor light emitting device 1001 may be connected to the first lead frame 1012 and the second lead frame 1014, respectively, through the solder bumps S1 and S2 interposed between the semiconductor light emitting device 1001 and the pair of lead frames 1010.

The package body 1002 may have a reflective cup to enhance light reflection efficiency and light extraction efficiency. The encapsulant 1005 formed of a light-transmissive material may be formed in the reflective cup to encapsulate the semiconductor light emitting device 1001.

The encapsulant 1005 may include a wavelength conversion material. The encapsulant 1005 may be formed by containing one or more types of phosphors emitting light having different wavelengths upon being excited by light generated in the semiconductor light emitting device 1, in a light-transmissive resin. Accordingly, blue light, green light, or red light may be emitted, and white light, ultraviolet light, and the like, may also be emitted through adjustment.

For example, when the semiconductor light emitting device 1 emits blue light, blue light may be combined with yellow, green, red, and orange phosphors to emit white light. In addition, at least one of semiconductor light emitting devices 1 emitting purple, blue, green, red, and/or infrared light may be provided. In this case, the semiconductor light emitting device 1 may control a color rendering index (CRI) to range from 40 to 100, or the like, and control a color temperature ranging from 2000K to 20000K to generate various levels of white light. If necessary, the semiconductor light emitting device 1 may generate visible light having purple, blue, green, red, orange colors, or infrared light to adjust an illumination color according to a surrounding atmosphere or mood. In addition, the semiconductor light emitting device 1 may generate light having a special wavelength stimulating plant growth.

Figure 15:
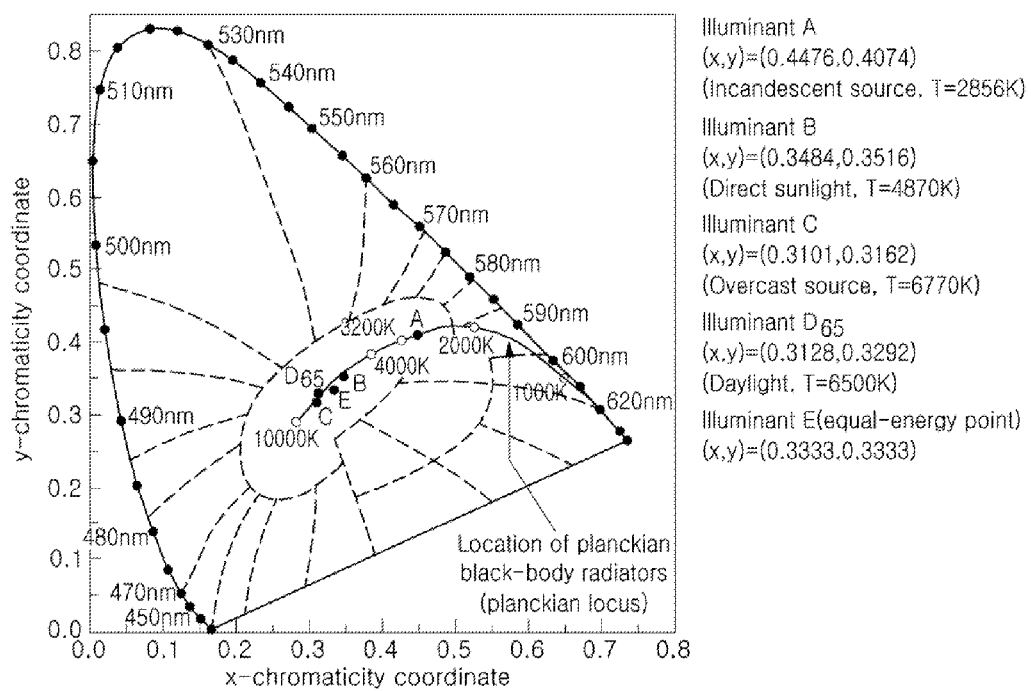
FIG. 15 is a CIE 1931 color space chromaticity diagram.

White light generated by combining yellow, green, red phosphors with a blue light emitting device and/or by combining at least one of a green light emitting device and a red light emitting device therewith, may have two or more peak wavelengths and may be positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram illustrated in FIG. 15. Alternatively, white light may be positioned in a region surrounded by a spectrum of black body radiation and the segment. A color temperature of white light corresponds to a range from about 2000K to about 20000K.

Phosphors may have the following empirical formulas and colors:

Oxides: Yellow and green $Y_3Al_5O_{12}$:Ce, $Tb_3Al_5O_{12}$:Ce, $Lu_3Al_5O_{12}$:Ce Silicates: Yellow and green $(Ba,Sr)_2SiO_4$:Eu, yellow and orange $(Ba,Sr)_3SiO_5$:Ce Nitrides: Green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$, where $0.5 \leq x \leq 3$, $0 < z < 0.3$, and $0 < y \leq 4$ (Here, Ln may be at least one type of element selected from the group consisting of Group IIIa elements and rare earth elements, and M may be at least one type of element selected from the group consisting of calcium (Ca), barium (Ba), strontium (Sr), and magnesium (Mg)).

Fluorides: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$ Phosphor compositions should basically conform with Stoichiometry, and respective elements may be substituted with different elements of respective groups of the periodic table. For example, strontium (Sr) may be substituted with barium (Ba), calcium (Ca), magnesium (Mg), and the like, of alkali earths, and yttrium (Y) may be substituted with terbium (Tb), Lutetium (Lu), scandium (Sc), gadolinium (Gd), and the like. In addition, europium (Eu), an activator, may be substituted with cerium (Ce), terbium (Tb), praseodymium (Pr), erbium (Er), ytterbium (Yb), and the like, according to a desired energy level, and an activator may be applied alone, or a coactivator, or the like, may be additionally applied to change characteristics.

In addition, materials such as quantum dots, or the like, may be applied as materials that replace phosphors, and phosphors and quantum dots may be used in combination or alone.

A quantum dot (QD) may have a structure including a core (having a diameter ranging from 3 nm to 10 nm) such as CdSe or InP, a shell (having a thickness ranging from 0.5 nm to 2 nm) such as ZnS or ZnSe, and a ligand for stabilizing the core and the shell, and may realize various colors according to sizes.

Referring to FIG. 14B, a semiconductor light emitting device package 2000 may include a semiconductor light emitting device 2001, a mounting board 2010, and an encapsulant 2005. The semiconductor light emitting device 2001 may be the semiconductor light emitting device 1 of FIG. 1 and a detailed description thereof will be omitted.

The semiconductor light emitting device 2001 may be mounted on the mounting board 2010 and electrically connected to first and second circuit patterns 2012 and 2014. The semiconductor light emitting device 2001 may be encapsulated by the encapsulant 2005. In this manner, a chip-on-board (COB) type package structure may be realized.

The mounting board 2010 may be provided as a printed circuit board (PCB), metal-core printed circuit board (MCPCB), a metal printed circuit board (MPCB), a flexible printed circuit board (FPCB), or the like, and a structure of the mounting board 2010 may be applied in various forms. The semiconductor light emitting device 2001 may be electrically connected to the first and second circuit patterns 2012 and 2014 through a conductive bonding material. As the conductive bonding material, for example, solder bumps S1 and S2 including Sn may be used.

Figure 16:
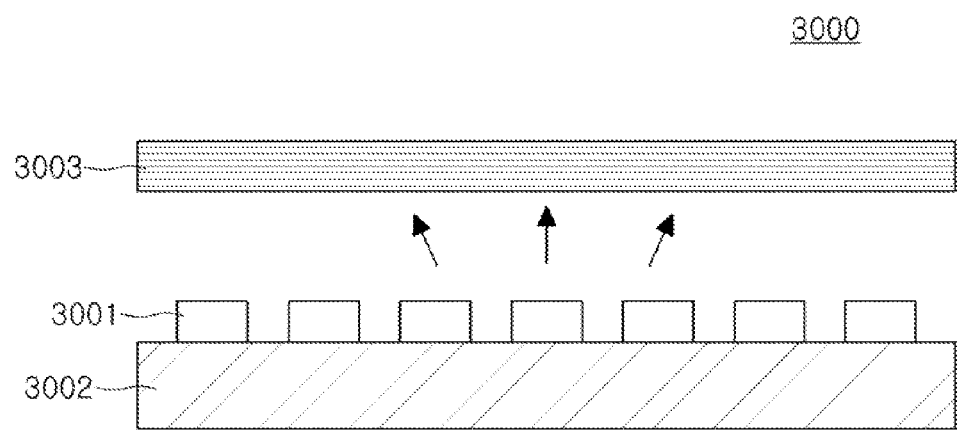
FIGS. 16 and 17 are views illustrating examples of backlight units employing a semiconductor light emitting device, according to an exemplary embodiment.
Figure 17:
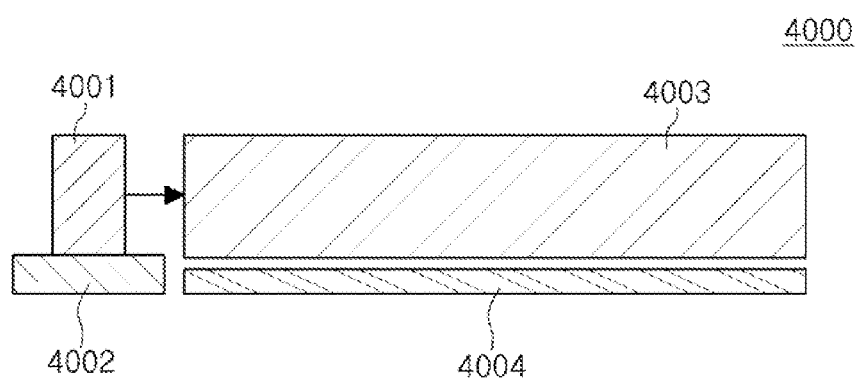

FIGS. 16 and 17 are views illustrating examples of backlight units employing a semiconductor light emitting device according to an exemplary embodiment.

Referring to FIG. 16, a backlight unit 3000 includes light sources 3001 mounted on a board 3002 and one or more optical sheets 3003 disposed above the light sources 3001. A semiconductor light emitting device package having the structure described above with reference to FIG. 1 or a structure similar thereto may be used as the light sources 3001. Alternatively, a semiconductor light emitting device may be directly mounted on the board 3002 (a so-called COB type mounting scheme) and used as the light source.

Unlike the backlight unit 3000 in FIG. 16 in which the light sources 3001 emit light toward an upper side where a liquid crystal display is disposed, a backlight unit 4000 as another example illustrated in FIG. 17 is configured such that a light source 4001 mounted on a board 4002 emits light in a lateral direction, and the emitted light may be incident to a light guide plate 4003 so as to be converted into a surface light source. Light, passing through the light guide plate 4003, is emitted upwards, and in order to enhance light extraction efficiency, a reflective layer 4004 may be disposed on a lower surface of the light guide plate 4003.

Figure 18:
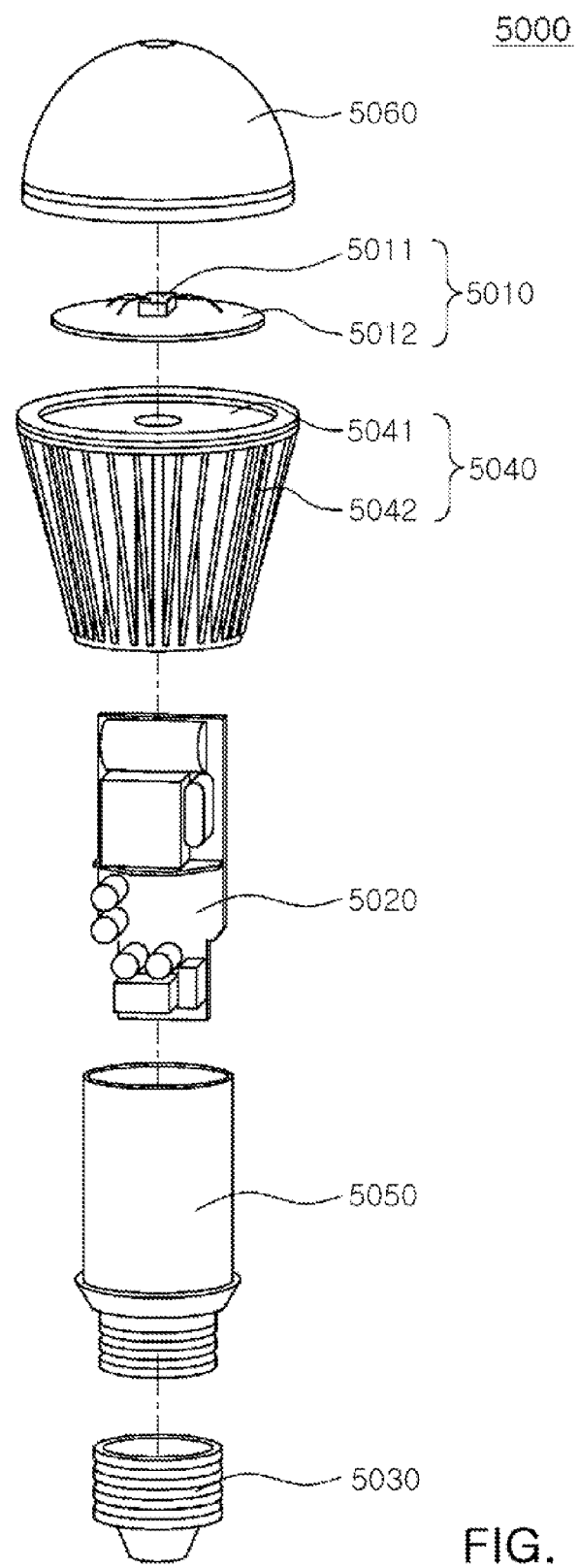
FIG. 18 is a view illustrating an example of a lighting device employing a semiconductor light emitting device package, according to an exemplary embodiment.

FIG. 18 is a view illustrating an example of a lighting device employing a semiconductor light emitting device package according to an exemplary embodiment.

Referring to FIG. 18, a lighting device 5000 is a bulb-type lamp and includes a light emitting module 5010, a driving unit 5020, and an external connection unit 5030. In addition, the lighting device 5000 may further include external structures such as external and internal housings 5040 and 5050 and a cover 5060.

The light emitting module 5010 may include a semiconductor light emitting device 5011 having a structure the same as or similar to that of the semiconductor light emitting device 1 of FIG. 1 and a circuit board 5012 on which the semiconductor light emitting device 5001 is mounted. In the present exemplary embodiment, a single semiconductor light emitting device 5011 is mounted on the circuit board 5012, but a plurality of semiconductor light emitting devices may be installed as needed. In addition, the semiconductor light emitting device 5011 may be manufactured as a package and subsequently mounted, rather than being directly mounted on the circuit board 5012.

The external housing 5040 may serve as a heat dissipation unit and may include a heat dissipation plate 5041 disposed to be in direct contact with the light emitting module 5010 to enhance heat dissipation and heat dissipation fins 5042 surrounding the lateral surfaces of the external housing 5040. The cover 5060 may be installed on the light emitting module 5010 and have a convex lens shape. The driving unit 5020 may be installed in the internal housing 5050 and connected to the external connection unit 5030 having a socket structure to receive power from an external power source. In addition, the driving unit 5020 may serve to convert power into an appropriate current source for driving the semiconductor light emitting device 5011 and provide the same. For example, the driving unit 5020 may be configured as an AC-DC converter, a rectifying circuit component, and the like.

In addition, although not shown, the lighting device 5000 may further include a communication module.

Figure 19:
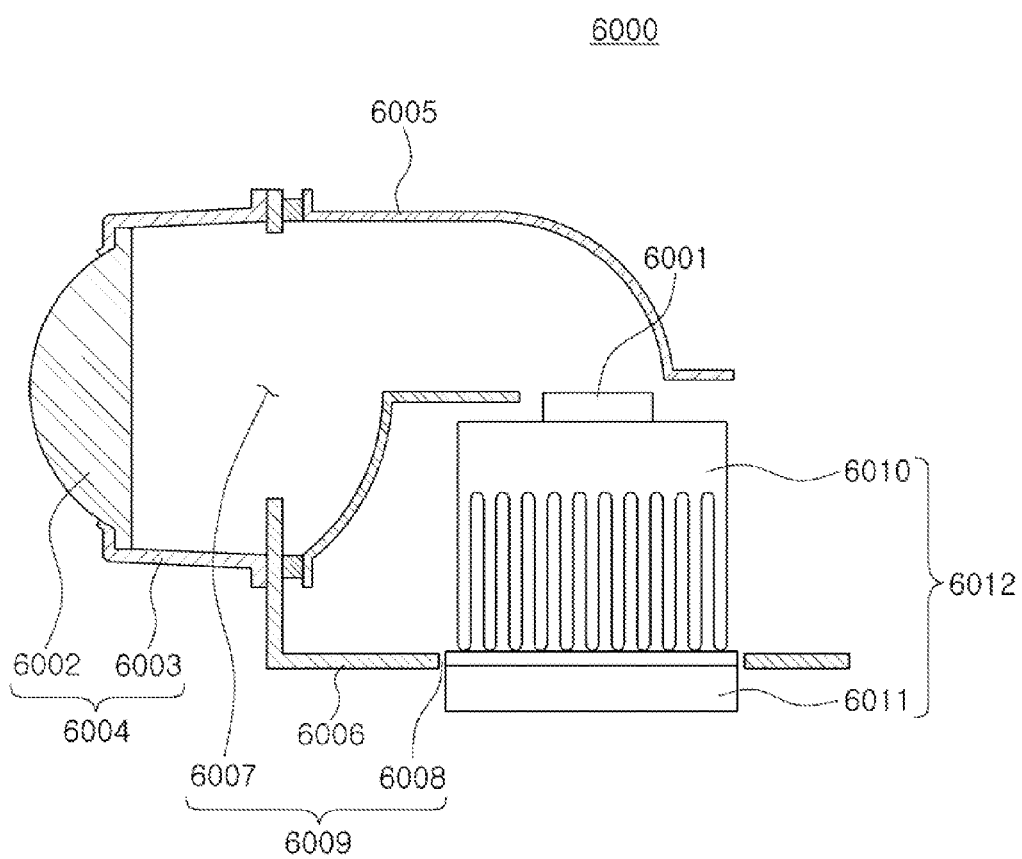
FIG. 19 is a view illustrating an example of a headlamp employing a semiconductor light emitting device, according to an exemplary embodiment.

FIG. 19 is a view illustrating an example of a headlamp employing a semiconductor light emitting device according to an exemplary embodiment.

Referring to FIG. 19, a head lamp 6000 used as a vehicle lamp, or the like, may include a light source 6001, a reflective unit 6005, and a lens cover unit 6004. The lens cover unit 6004 may include a hollow guide 6003 and a lens 6002. The light source 6001 may include the semiconductor light emitting device described above or a package having the semiconductor light emitting device.

The head lamp 6000 may further include a heat dissipation unit 6012 dissipating heat generated by the light source 6001 outwardly. In order to effectively dissipate heat, the heat dissipation unit 6012 may include a heat sink 6010 and a cooling fan 6011. In addition, the head lamp 6000 may further include a housing 6009 fixedly supporting the heat dissipation unit 6012 and the reflective unit 6005, and the housing 6009 may have a body unit 6006 and a central hole 6008 formed on one surface thereof, in which the heat dissipation unit 6012 is coupled.

The housing 6009 may have a front hole 6007 formed on the other surface integrally connected to the one surface and bent in a right angle direction. The front hole 6007 may allow the reflective unit 6005 to be fixedly positioned above the light source 6001. Accordingly, a front side is opened by the reflective unit 6005, and the reflective unit 6005 is fixed to the housing 6009 such that the opened front side corresponds to the front hole 6007, and light reflected by the reflective unit 6005 may pass through the front hole 6007 so as to exit outwardly.

Figure 20:
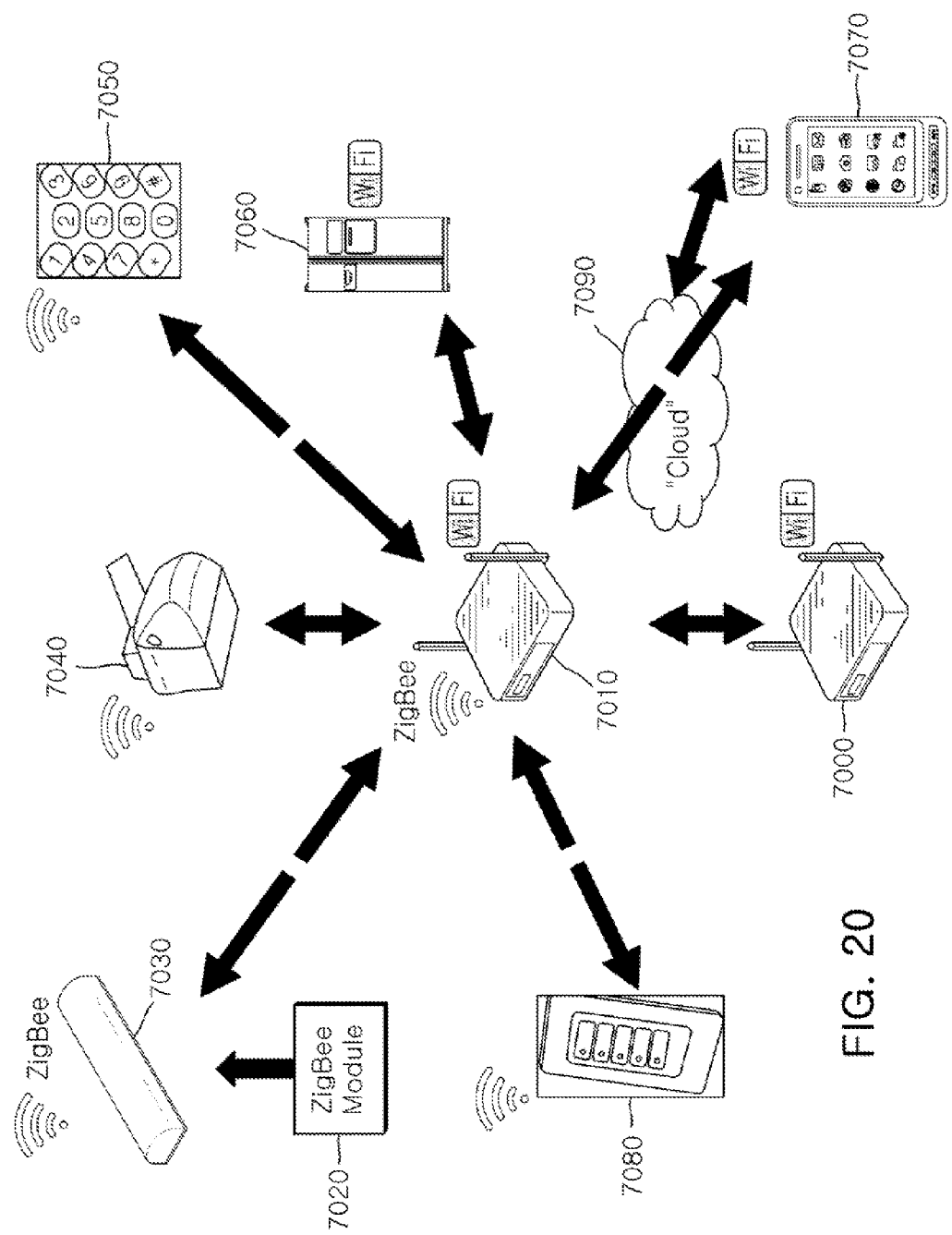
FIGS. 20 and 21 are views schematically illustrating a home network employing a lighting system using a lighting device, according to an exemplary embodiment.
Figure 21:
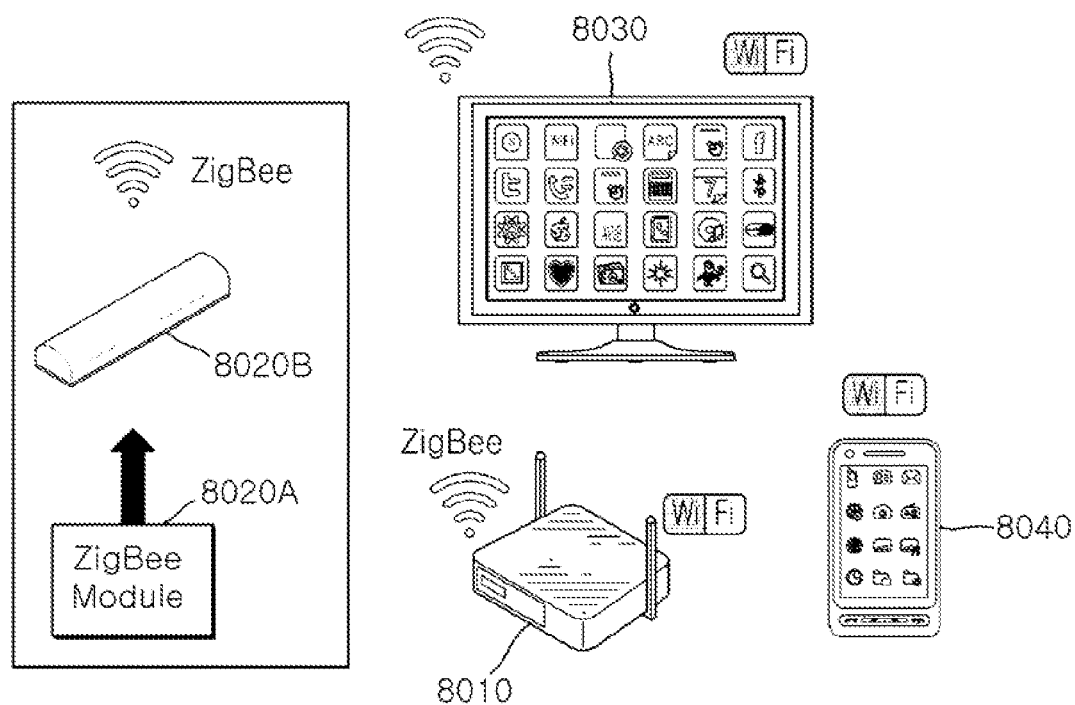

FIGS. 20 and 21 are views schematically illustrating a home network employing a lighting system using a lighting device according to an exemplary embodiment.

As illustrated in FIG. 20, a home network may include a home wireless router 7000, a gateway hub 7010, a ZigBee™ module 7020, a lighting device 7030, a garage door lock 7040, a wireless door lock 7050, a home application 7060, a cellular phone 7070, a switch 7080 installed on the wall, and a cloud network 7090.

Operational states of a bedroom, a living room, entrance, a garage, home appliances, and illumination brightness of the lighting device 7030 may be automatically adjusted by utilizing home wireless communications (ZigBee™, Wi-Fi, and the like).

For example, as illustrated in FIG. 21, brightness of a lighting device 8020B may be automatically adjusted using a gateway 8010 and a ZigBee™ module 8020A according to types of programs broadcast in a TV 8030 or brightness of a screen. For example, when a human drama is aired so a cozy atmosphere is required, a color tone may be adjusted such that a color temperature of illumination is decreased to 5000K or below. In another example, in a light atmosphere such as a gag program, a color temperature of illumination is increased to 5000K or higher and illumination is adjusted to white illumination base on a blue color.

In addition, illumination brightness of the lighting device 8020B may be controlled through a cellular phone 8040 using the gateway 8010 and the ZigBee™ module 8020A.

The ZigBee™ modules 7020 and 8020A may be integrally modularized with an optical sensor and may be integrally configured with a lighting device.

The visible light wireless communications technology is a wireless communications technology transferring information wirelessly by using light having a visible light wavelength band recognizable by the naked eye. The visible light wireless communications technology is distinguished from a wired optical communications technology in that it uses light having a visible light wavelength band and that a communications environment is based on a wireless scheme.

In addition, unlike RF wireless communications, the visible light wireless communications technology has excellent convenience and physical security properties as it can be freely used without being regulated or needing permission in the aspect of frequency usage, and is differentiated in that a user can physically check a communications link, and above all, the visible light wireless communications technology has features as a convergence technology that obtains both a unique purpose as a light source and a communications function.

LED lighting may be utilized as an internal or external light source of a vehicle. As an internal light source, the LED lighting device may be used as an indoor light, a reading light, or as various dashboard light sources of a vehicle. As an external light source, the LED lighting device may be used as a headlight, a brake light, a turn signal lamp, a fog light, a running light, and the like.

LED lighting using light within a particular wavelength band may promote plant growth and stabilize a person's mood or treat diseases. In addition, an LED may also be applicable as a light source used in robots or various mechanic facilities. Associated with low power consumption and long lifespan of LEDs, lighting may be realized by nature-friendly new and renewable energy power system such as solar cells, wind force, and the like.

As set forth above, according to exemplary embodiments, the semiconductor light emitting device in which light absorption by the electrode pads is reduced and insulation is secured between the contact electrodes and the electrode pads, and the semiconductor light emitting apparatus having the same may be provided.

While exemplary embodiments have been shown and described above, it will be apparent to those skilled in the art that modifications and variations could be made without departing from the scope of the inventive concept as defined by the appended claims.

What is claimed is:

1. A semiconductor light emitting device comprising:
    a light emitting structure comprising a first conductivity-type semiconductor layer having an upper surface divided into first and second regions, an active layer and a second conductivity-type semiconductor layer sequentially disposed on the second region of the first conductivity-type semiconductor layer;
    a first contact electrode disposed on the first region of the first conductivity-type semiconductor layer;
    a second contact electrode disposed on the second conductivity-type semiconductor layer;
    a first electrode pad electrically connected to the first contact electrode and having at least a portion disposed on the second contact electrode;
    a second electrode pad electrically connected to the second contact electrode; and
    a multilayer reflective structure interposed between the first electrode pad and the second contact electrode, directly contacting the first electrode pad to insulate the first electrode pad from the second contact electrode, and comprising a plurality of dielectric layers which have different refractive indices and are alternately stacked.

2. The semiconductor light emitting device of claim 1, wherein the multilayer reflective structure forms a distributed Bragg reflector in which a first dielectric layer having a first refractive index and a second dielectric layer having a second refractive index are alternately stacked.

3. The semiconductor light emitting device of claim 1, wherein the multilayer reflective structure is disposed on the light emitting structure to cover the light emitting structure overall and to redirect light traveling in an opposite direction of a substrate of the semiconductor light emitting device to a direction of the substrate.

4. The semiconductor light emitting device of claim 1, further comprising an insulating layer disposed on the light emitting structure such that at least portions of the first and second contact electrodes are exposed.

5. The semiconductor light emitting device of claim 4, wherein the insulating layer forms a distributed Bragg reflector in which a plurality of dielectric layers having different refractive indices are alternately stacked.

6. The semiconductor light emitting device of claim 4, wherein the insulating layer comprises the same material as a material of the multilayer reflective structure.

7. The semiconductor light emitting device of claim 4, wherein the insulating layer has a substantially same thickness as a thickness of one dielectric layer of the multilayer reflective structure.

8. The semiconductor light emitting device of claim 4, wherein the multilayer reflective structure is disposed on the insulating layer and comprises a first opening exposing a region of the first contact electrode and a second opening exposing a region of the second contact electrode, and the first and second electrode pads are connected to the first and second contact electrodes through the first and second openings, respectively.

9. The semiconductor light emitting device of claim 8, wherein the multilayer reflective structure comprises a plurality of first and second openings, and the first and second electrode pads are connected to the first and second contact electrodes through the plurality of the first and second openings, respectively.

10. The semiconductor light emitting device of claim 4, wherein the insulating layer is disposed on the multilayer reflective structure which comprises a plurality of openings disposed on the first and second contact electrodes, respectively.

11. The semiconductor light emitting device of claim 1, wherein a portion of the multilayer reflective structure is disposed to be in contact with a surface of the light emitting structure.

12. The semiconductor light emitting device of claim 1, further comprising a passivation layer which is disposed on the electrode pads and comprises a plurality of bonding regions partially exposing the first and second electrode pads.

* * * * *